US006329849B1

(12) United States Patent
Czarnul et al.

(10) Patent No.: US 6,329,849 B1
(45) Date of Patent: Dec. 11, 2001

(54) APPARATUS AND METHOD FOR CONVERTING DIFFERENTIAL VOLTAGE TO FULLY BALANCED CURRENTS

(75) Inventors: Zdzislaw Czarnul; Hirotomo Ishii; Kazuhiro Oda, all of Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/438,428

(22) Filed: Nov. 12, 1999

(30) Foreign Application Priority Data

Nov. 12, 1998 (JP) .................................................. 10-322131

(51) Int. Cl.$^7$ ....................................................... H03L 5/00
(52) U.S. Cl. ........................................... 327/103; 327/323
(58) Field of Search ..................................... 327/103, 552, 327/323, 100, 108

(56) References Cited

U.S. PATENT DOCUMENTS 5,661,432 * 8/1997 Chang et al. ......................... 327/552
6,121,818 * 9/2000 Kim et al. .............................. 327/103

FOREIGN PATENT DOCUMENTS 3-179812    8/1991  (JP) .

OTHER PUBLICATIONS

"A Low–Distortion BiCMOS Seventh–Order Bessel Filter Operating at 2.5V Supply" IEEE Journal of Solid State Circuits, vol. 31, No. 3, Mar. 1996; F. Yang, et al.; pp. 321–330.

"Fully Differential Operational Amplifiers with Accurate Output Balancing" IEEE Journal of Solid State Circuits, vol. 23, No. 6, Dec. 1998; M. Banu, et al.; pp. 1410–1414.

"A Single–Ended–Input Fully–Balanced–Output CMOS Circuit" $1^{st}$ Analog VLSI Workshop Proceedings, ECT 97–34, pp. 13–16, May 1997; C. Hwang, et al.

"A 3V 12–55MHz BiCMOS Continuous–Time Filter with Pseudo–Differential Structure" Twenty–first European Solid–State Circuits Conference Proceedings, Sep. 1995; F. Rezzi, et al.; pp. 74–77.

CMOS—Circuit Design, Layout, and Simulation, Chap. 25; R. J. Baker, et al.; 1997; pp. 666–669.

* cited by examiner

*Primary Examiner*—Jung Ho Kim
(74) *Attorney, Agent, or Firm*—Oblon, Spivak, McClelland, Maier & Neustadt, P.C.

(57) ABSTRACT

The apparatus for converting a differential input voltage to two fully balanced output currents is achieved by providing a common mode control circuit of a simplified circuit construction to an operational transconductance amplifier. The apparatus includes an operational transconductance amplifier that is comprised of an OTA input section for converting two input voltages of the differential input voltage to a pair of interim output currents and an OTA output section for converting the interim output currents to the output currents, and a common mode controlling circuit for providing a control voltage to the OTA. The common mode control circuit is comprised of a substantially same circuit construction as the OTA output section and generates two output control currents based on the interim output currents from the OTA input section and the two output control currents from the common mode control circuit are summed and kept to be substantially zero in order to control the output currents from the OTA output section fully balanced.

9 Claims, 18 Drawing Sheets

US 6,329,849 B1

APPARATUS AND METHOD FOR CONVERTING DIFFERENTIAL VOLTAGE TO FULLY BALANCED CURRENTS

BACKGROUND OF THE INVENTION

1. Field of the Invention

The present invention relates to apparatus and method for converting differential input voltage to fully balanced output currents.

More particularly, the present invention relates to an apparatus and method for converting differential input voltage to fully balanced output currents by adding/duplicating an output section of an operational transconductance amplifier.

2. Discussion of the Background

Furthermore, the present invention relates to an apparatus and method for controlling common mode component of two output currents by using a simplified common mode controlling circuit.

As an input differential voltage/output currents converter, an operational transconductance amplifier (hereinafter referred to as an "OTA") has been developed for converting input differential voltage $V_1$–$V_2$ into two output currents $I_{O1}$, $I_{O2}$, which are assumed to be balanced around a fixed constant value of a reference current $I_{REFCM}$. In the simplest version of the OTA that can convert the input differential voltage into two fully balanced output currents $I_{o1}$, $I_{o2}$ (hereinafter referred to as a "FB-OTA") the value of a reference current $I_{REFCM}$ is assumed to be zero. Usually, such a FB-OTA includes load circuits which are coupled to the output terminals of the OTA, respectively. In general, each of load circuits has the same impedance.

Typically, when differential input voltage $V_1$–$V_2$ is applied to the OTA, the converted output currents $I_{O1}$, $I_{O2}$ inevitably include common mode component due to influences of outside noises during conversion in the OTA. In particular, when the OTA, which is a part of analog system, is integrated with digital systems together on the same substrate, the converted output currents include common mode component due to noises which are generated from the digital circuits. Consequently, it has been need to take some measurements for eliminating such undesired common mode components at the output currents to make the available amplitude of a differential output voltage as large as possible.

Conventionally, a common mode control circuit has been proposed to apply to the OTA for generating a common mode feedback control signal or a common mode feedforward control signal to the OTA. The former type OTA is called as a common mode feedback controlled type OTA (hereinafter referred to as a "CMFB"-OTA). The latter type OTA is called as a common mode feedforward controlled type OTA (hereinafter referred to as a "CMFF"-OTA)

FIGS. 14–18 are related to a conventional common mode feedback controlled type fully balanced OTA implementations. FIG. 19 shows an example of a common mode feedforward controlled type fully balanced OTA implementation.

In FIG. 14, the CMFB-OTA includes an OTA (1) for converting differential input voltage $V_1$–$V_2$ to two output currents $I_{O1}$, $I_{O2}$, and a CMFB circuit (2a) for generating common mode feedback control voltage $V_B$ to the OTA (1). The output terminals of the OTA(1) are coupled to load circuits (3a), (3b), respectively.

When the OTA(1) converts the differential input voltage $V_1$ $V_2$ into two output currents $I_{O1}$, $I_{O2}$, available from the output terminals of the OTA(1), the output voltages $V_{O1}$, $V_{O2}$ are produced in accordance with a respective impedance of the load circuits (3a), (3b). The CMFB circuit (2a) generates a feedback control voltage $V_B$, which is a function of output voltages $V_{O1}$, $V_{O2}$, for strong suppression/elimination of a common mode component in the output currents $I_{o1}$, $I_{o2}$.

FIG. 15 shows a conventional circuit of the OTA (1). The OTA (1) is comprised of four PMOS transistors (Q101)–(Q104), two NMOS transistors (Q105), (Q106), four constant-current sources (101)–(104) and a resistor (R1). The input voltages $V_1$, $V_2$ are respectively applied to each of the gate terminals of the NMOS transistors (Q105) and (Q106). The CMFB circuit (2a) supplies a control voltage $V_B$ to a commonly coupled gate terminals of the two PMOS transistors (Q101) and (Q102) in the OTA(1). A predetermined voltage $V_{BO}$ is applied to the respective gate terminals of the another two PMOS transistors (Q103) and (Q104). From the respective drain terminals of these two PMOS transistors (Q103) and (Q104), output currents $I_{O1}$, $I_{O2}$, are available, respectively. The differential output voltage $V_{O1}$–$V_{O2}$ is produced in accordance with the impedance for each of the load circuit (3a) and (3b).

FIG. 16 shows a conventional CMFB circuit (2a). The circuit construction has been disclosed in a publication, IEEE Journal of Solid State Circuits, Vol.23, No.6, pp.1410–1414, December 1988 as in the tile of "Fully Differential Operational Amplifiers with Accurate Output balancing" by M. Banu, J. M. Khoury and Y. Tsividis.

In FIG. 16, the CMFB circuit (2a) is comprised of a buffer circuit (110), a voltage divider (111) and a sense amplifier (112). The buffer circuit (110) is comprised of two operational amplifier (OP1), (OP2). The voltage divider (111) is comprised of two resistors (R2), (R3) and two capacitors (C1), (C2). The sense amplifier (112) is constructed with two PMOS transistors (Q111), (Q112), two NMOS transistors (Q113), (Q114) and a constant-current source (113). The output voltages $V_{O1}$, $V_{O2}$ from the OTA (1) are applied to the buffer circuit (110). It is required, the input impedance of a buffer circuit to be as large as possible. Assuming a very high gain of OP1 and OP2, the gain of the buffer circuits become very closed to one.

When both of the two resistors (R2) and (R3) have the same resistance value and also both of the two capacitors (C1) and (C2) has the same capacitance value, a control voltage $V_{Csens}$ at the output of the voltage divider (111) is expressed by the following equation (1).

$$V_{Csens}=(V_{O1}+V_{O2})/2=V_{cm} \quad (1a)$$

The voltage $V_{cm}$ is named as a common mode output voltage. The differential mode output voltage is defined as follows $$V_{dm}=(V_{O1}-V_{O2})/2 \quad (1b)$$

According to (1a) and (1b) the output voltages $V_{O1}$, and $V_{O2}$ can be respectively expressed as follows.

$$V_{O1}=V_{dm}+V_{cm};$$

$$V_{O2}=-V_{dm}+V_{cm}$$

The main function of a FB-OTA is suppression, or more precisely elimination in an ideal case, of a common mode component $V_{cm}$ at $V_{o1}$ and $V_{o2}$.

The sense amplifier (112) in the CMFB circuit (2a) compares the output voltage $V_C=V_{cm}$ from the voltage divider (111) and a reference voltage $V_{ref}$ that is applied from the outside. The sense amplifier (112) provides a control voltage $V_B$ to OTA shown in FIG. 14 for which a common mode component at the OTA output voltages $V_{o1}$, $V_{o2}$ is strongly suppressing (eliminating in an ideal case). Practically, the common mode voltage $V_{cm}$ is eliminated with respect to the reference voltage $V_{ref}$ by using the feedback output from the CMFB circuit. However, as depicted in FIG. 16, the conventional CMFB circuit (2a) must be comprised of two operational amplifiers (OP1) and (OP2). Further the CMFB circuit (2a) must include the sense amplifier (112). This configuration arises many of serious problems for making the voltage/current converter in a small sized compact form and with limited amount of a power consumption.

Another type of the CMFB circuit (2a), which allows a power consumption to be limited, is shown in FIG. 17. This circuit configuration has been disclosed in a publication "CMOS Circuit Design, Layout and Simulation" by R. J. Baker, H. W. Li and D. E. Boyce.

The CMFB circuit (2a) construction shown in FIG. 17 includes a first sense differential pair (121) for comparing an input voltage $V_{O1}$ with a reference voltage $V_{ref}$ and a second sense differential pair (122) for comparing an input $V_{O2}$ with the reference voltage $V_{ref}$. A control voltage $V_B$ is produced by summing up the results of the first and second sense differential pairs (121) and (122),. This summing up is meant to compare the voltage $(V_{O1}+V_{O2})/2$ with the reference voltage $V_{ref}$. Consequently, the CMFB circuit (2a) in FIG. 17 can achieve almost the same effect as using the circuit in FIG. 16. Consequently, the CMFB circuit in FIG. 17 can achieve similar effect without using the buffer circuit (110) and the voltage divider (111) such as shown in FIG. 16. However, a linearity of a CMFB circuit in FIG. 17 is very limited according to a low linearity of simple MOS differential pairs (121), (122).

Both of the CMFB circuits shown in FIGS. 16 and 17 are aimed to control the common mode output voltage $V_{cm}$ from the OTA.

The following equation expresses the relationship between the output common mode voltage $V_{cm}$, the output common-mode current $I_{cm}$ and the load admittance Y of the voltage/current converter.

$$I_{cm}=Y \cdot V_{cm}$$

According to the above equation, it can be pointed out that the output common-mode voltage from the voltage/current converter can also be controlled by the common-mode output current $I_{cm}$.

A such construction of voltage/current converter circuit, based on employing of the output common-mode current $I_{cm}$ to control the OTA output currents, is shown in FIG. 18. This circuit has been disclosed in a publication of Japanese Institute of Electrical Engineers ECT-97-34, pp.13–16, May 1997 under a title of "A Single-Ended-Input Fully-Balanced-Output CMOS Circuit" by C. Wang, A. Hyogo and M. Ismail.

As similar to the converter shown in FIG. 14, the voltage/current converter in FIG. 18 includes an OTA(1) and a CMFB circuit(2a). The output terminals of the OTA(1) are coupled to load circuits (3a) and (3b), respectively. The OTA(1) comprises of an input section (11) for converting the input voltages $V_1$, $V_2$ to the output currents $I_{O1}$, $I_{O2}$. The output sections (12a) and (12b) are coupled to the input section (11). The output sections (12a) and (12b) are comprised of the same circuit construction. The CMFB circuit (2a) includes two current transfer sections (201a), (201b) and a control current generator (202). The current transfer sections (201a) and (201b) are constructed as the same circuit construction to the output sections (12a), (12b), respectively. The current transfer sections (201a), (201b) detect the output current $I_{O1}$, $I_{O2}$, respectively. The current outputs $I_{O1}$ and $I_{O2}$ are summed up and becomes a control current $I_C$.

Similar as for output voltages $V_{o1}$ and $V_{o2}$ (see (1)), also for output currents $I_{o1}$ and $I_{o2}$, a differential mode current component $I_{dm}$, and a common mode current component $I_{cm}$ can be defined. As a result the current outputs $I_{O1}$, $I_{O2}$ can be expressed as follows:

$$I_{O1}=I_{dm}+I_{cm}, \tag{2a}$$

$$I_{O2}=-I_{dm}+I_{cm} \tag{2b}$$

Consequently, the current $I_c$ becomes as the follow.

$$I_c=I_{O1}+I_{O1}=2\,I_{cm}$$

Note the above control current $I_c$ includes a common mode current only.

In FIG. 18, the control current generating section (202) includes a pair of transistors Q121, Q122 for comprising a first current mirror circuit and a pair of transistors Q123, Q124 for comprising a second current mirror circuit, and a transistor Q125, an operational amplifier (OP3) and a resistor (R4). A current $I_{ref}$ passes through the transistor Q122 in the first current mirror circuit. Since a channel width of the transistor Q121 is provided so as to be a double channel width of the transistor Q122, a current passing through the transistor Q121 becomes $2I_{ref}$. Accordingly, the current $2\,I_{ref}$ passing through the transistor Q121 and the current $I_c$ passing through the current transfer section (201) are summed and becomes a current $2\,I_{cm}$ at a connecting node Nc of the transistor Q121 and the transistor Q124 in FIG. 18.

The connecting node Nc is coupled to a common gate terminal of the transistors Q126 and Q127 for constructing a bias circuit in the input section (11). Since the input impedance of the gates of the transistors Q126 and Q127 is almost infinite, the current $I_{cm}$ becomes equal to the reference current $I_{ref}$.

However, the voltage/current converter shown in FIG. 18 needs a large chip area for installing the two current mirror circuits (Q121, Q122), (Q123, Q124), a resistor R4 and an operational amplifier OP3 in order to construct the CMFB circuit (2a). Further it needs a large amount of power consumption.

FIG. 19 shows a circuit construction of another example of a FB-OTA. The FB-OTA has been disclosed in a publication, IEEE Journal of Solid State Circuits, Vo.31, No.3, pp.321–330, March 1996 under a title "A Low-Distortion Bi-CMOS Seventh-Order Bessel Filter Operating at 2.5V Supply" by F. Yang, C. C. Enz. This FB-OTA also utilizes a common mode current output $I_{cm}$ from an OTA. The voltage/currents converter shown in FIG. 19 includes an OTA(1) and a CMFF circuit (2) for controlling a bias current in the OTA (1). The OTA (1) is comprised of a first circuit (211) for corresponding to an voltage input $V_1$ and a second circuit (212) for corresponding to an voltage input $V_2$. The first and second circuits are constructed in the same circuit construction.

The two MOS transistors (Q131) and (Q132) in the OTA (1) and a transistor (Q133) in the CMFF circuit (2) form a current mirror circuit. Accordingly, the transistors (Q131) and (Q132) in the OTA (1) have a current flow that is substantially equal to the current $I_c$ passing through the transistor (Q133) in the CMFF circuit (2). The two transistors (Q134) and (Q135) in the OTA(1) convert input voltages $V_1$, $V_2$ to output currents $I_1$, $I_2$. The CMFF circuit (2) has a substantially same circuit construction to the first and second circuits (211) and (212). However, in stead of using the transistors (Q134) and (Q135) in the first and second circuit, the CMFF circuit (2) has two transistors (Q136) and (Q137) connected in parallel, for the gate of which the input voltages $V_1$, $V_2$ are applied, respectively.

Even if each of the differential current outputs $I_1$, $I_2$ includes both of the differential mode current and a common mode current, the control current $I_C$ includes only a common mode current. Accordingly, by supplying the control current $I_C$ passing through the current mirror circuit to the OTA (1) as a bias current, the common mode included in the OTA input signals are eliminated.

The voltage/current converter shown in FIG. 19 has several benefits for making the apparatus in an easy design and making an operational speed of the apparatus faster due to supplying a control signal in a feedforward control. This can make faster than the apparatus of a feedback control. However, this voltage/current converter has another problem. That is, although this converter can eliminate the common mode signals included in the input signals $V_1$, $V_2$, it can not eliminate the common mode signals generated in the OTA (1).

SUMMARY OF THE INVENTION

Accordingly, one object of the present invention is to solve the aforementioned problems of the conventional apparatus and method for converting differential input voltage to fully balanced output currents.

Another object of the present invention is to provide a novel apparatus and methods for converting differential input voltage to fully balanced output currents by stabilizing common mode output current component at a predetermined fixed constant value.

More particularly, an object of the present invention is to provide a novel apparatus and method for converting differential input voltage to fully balanced output currents that can be performed by a simplified circuit construction.

Further object of the present invention is to provide an apparatus and method for converting differential input voltage to fully balanced output currents that can be constructed in a small mounting chip area and can consume a smaller power than the conventional apparatus.

Still further object of the present invention is to provide an apparatus and method for converting differential input voltage to fully balanced output currents that can eliminate common mode component in the output currents generated during conversion in the fully balanced type OTA apparatus.

For achieving these objects, the apparatus for converting differential input voltage to fully balanced output currents according to the present invention comprises a voltage/currents converting circuit, the converting circuit is divided into a converting circuit input section for converting the input voltages to interim currents and a converting circuit output section for converting the interim currents to the fully balanced output currents; and a common mode controlling circuit for controlling the common mode component of output currents to be stabled at a fixed value, the common mode controlling circuit is made of a substantially same circuit construction of the converting circuit output section for generating control current to provide them to the voltage/current converting circuit with based on the interim currents from the converting circuit input section. There is a pair of load circuits, the first of which is coupled between the first OTA output and a reference voltage and the second of which is coupled between the second OTA output and a reference voltage, respectively.

BRIEF DESCRIPTION OF THE DRAWINGS

A more complete appreciation of the present invention and many of the attendant advantages thereof will be obtained as the same becomes better understood by reference to the following detailed description when considered in connection with the accompanying drawings, wherein.

DESCRIPTION OF THE PREFERRED EMBODIMENTS

Figure 1:
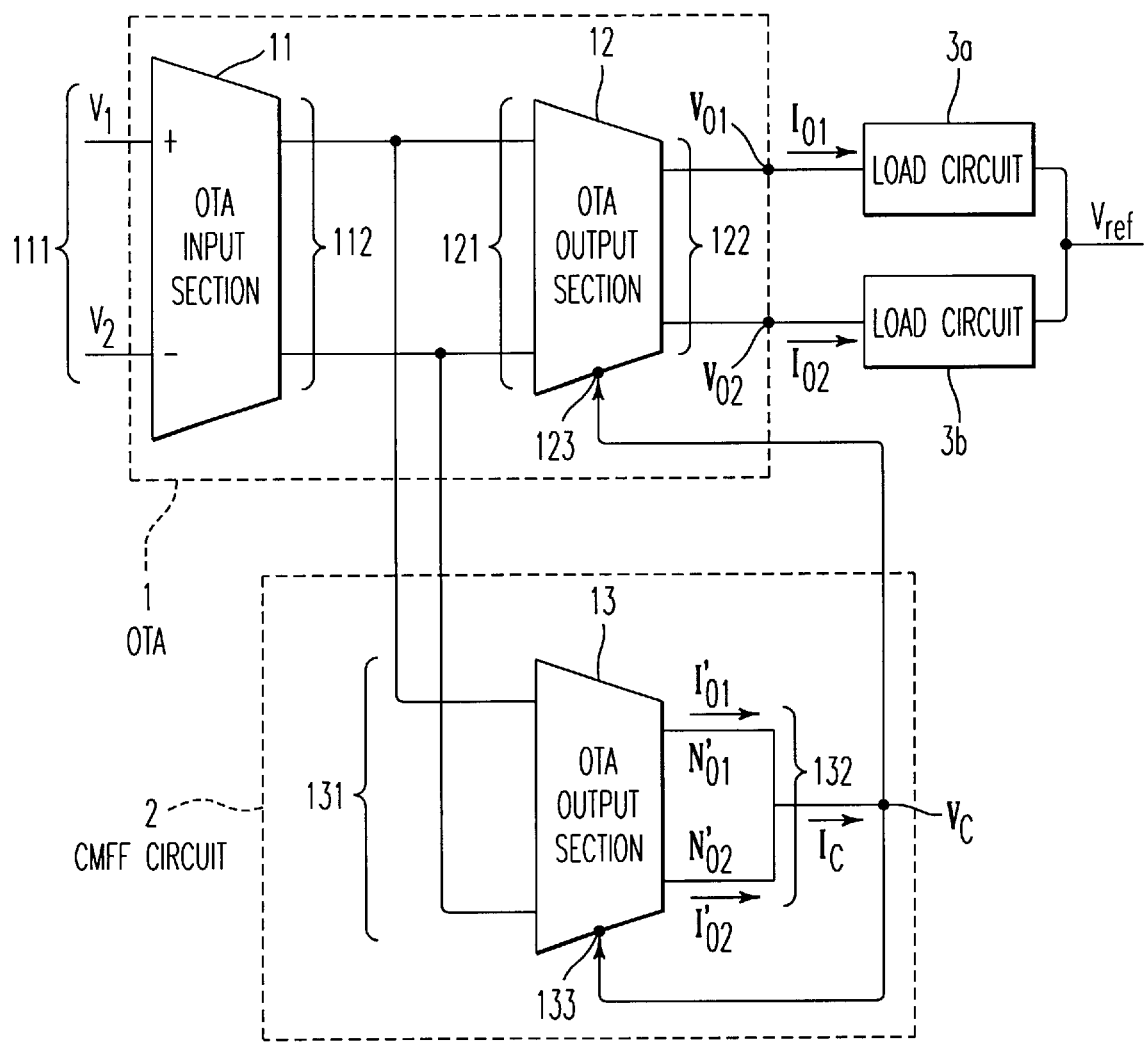
FIG. 1 is a block diagram illustrating the first embodiment of the differential voltage/fully balanced currents converting apparatus according to the present invention.

Referring now to the drawings, wherein like numerals designate identical or corresponding parts throughout the several views, and more particularly, FIG. 1 thereof, there is illustrated a first embodiment of the voltage/currents converter according to the present invention.

As shown in FIG. 1, the apparatus for converting a differential input voltage $V_1-V_2$ to two fully balanced output currents $I_{O1}$, $I_{O2}$ according to the present invention includes an OTA (1) with two output terminals and a common mode feedforward control (CMFF) circuit (2) The fully balanced output currents $I_{O1}$, $I_{O2}$ means that their sum $I_{O1}+I_{O2}$ is always constant and it can be fixed at any a predetermined value.

The OTA (1) is comprised of an OTA input section (11) and an OTA output section (12). And the feedforward controlling type CMFF circuit (2) is constructed by the same circuit construction as the OTA output section (12) for simplifying the total circuit construction of the apparatus.

The differential input voltage $V_1-V_2$ is supplied to a pair of input terminals (111) of the OTA input section (11). A pair of interim output currents are generated at a pair of the output terminals (112) of the OTA input section (11). The interim output currents supply both of the input terminals of the OTA output section (121) and the CMFF circuit (131). The OTA output section (12) and the CMFF circuit (13) have a respective high impedance control terminal (123) and (133). Both output terminals (132) of the CMFF circuit (13) are connected together and both control currents $I'_{o1}$, $I'_{o2}$ are summed. Their sum $I'_{o1}+I'_{o2}$ is equal to zero because the current $I_c$ is assumed to be always zero, according to a high impedance property of control terminal (123) and (133). However, the control voltage $V_c$ is created in this node. The control voltage $V_c$ is applied to both of the respective control terminals (123) and (133) of the OTA output section (12) and the CMFF circuit (2).

The control voltage $V_c$ from the CMFF circuit (2) is adjusted to such a value $V_c$, for which the common mode component of the output currents $I'_{o1}$, $I'_{o2}$ is zero. It is assumed that the schematic of OTA output section (12) is exactly the same as the schematic of OTA output section (13), and the geometrical parameters of all elements in section (12) are accurately proportional with factor k to the geometrical parameters of corresponding elements in section (13). As a result, the proposed OTA architecture has the following property $$I_{O1}=k\cdot I'_{o1}$$

$$I_{O2}=k\cdot I'_{o2}$$

Namely, $$I_{O1}+I_{O2}=k\cdot(I'_{o1}+I'_{o2})$$

It means that the common mode component of currents $I_{o1}$ and $I_{o2}$ is exactly proportional to the very well controlled common mode component of currents $I'_{o1}$ and $I'_{o2}$. If the common mode component of currents $I'_{o1}$ and $I'_{o2}$ is rejected/suppressed then a common mode component of currents $I_{o1}$ and $I_{o2}$ is also rejected/suppressed.

The pair of the output terminals of the OTA output section (12) are respectively coupled to each of a pair of load circuits (3a) and (3b). The output sides of the pair of the load circuits (3a) and (3b) are commonly connected to a reference voltage $V_{ref}$. Assuming that $I'_{O1}+I'_{o2}=0$, the above connections allow the output voltages to be fully symmetrical /balanced around a reference voltage $V_{ref}$ as shown in the following equations $$(V_{o1}-V_{ref})Y+(V_{o2}-V_{ref})Y=I_{o1}+I_{o2}=k\cdot(I'_{O1}+I'_{o2})=0$$

Consequently, $$(V_{o1}+V_{o2})/2=V_{ref}$$

One of features of this embodiment of the apparatus according to the present invention is that the OTA(1) is divided into the OTA input section (11) and the OTA output section (12), and that the CMFF circuit (2) is constructed by the substantially same circuit of the OTA output section (12). Another feature of this embodiment is that the CMFF circuit (2) generates control signals with based on the interim current outputs from OTA input section (11) and provide them to OTA output section (12) as a feedforward control signal. These features give benefits for making the apparatus in a simplified construction with eliminating common mode currents and achieving a lower power consumption.

Further, the output common-mode voltages of the apparatus are controlled so as to equal to the reference voltage $V_{ref}$ that is supplied to one end of the load circuit (3a) and (3b).

Figure 2:
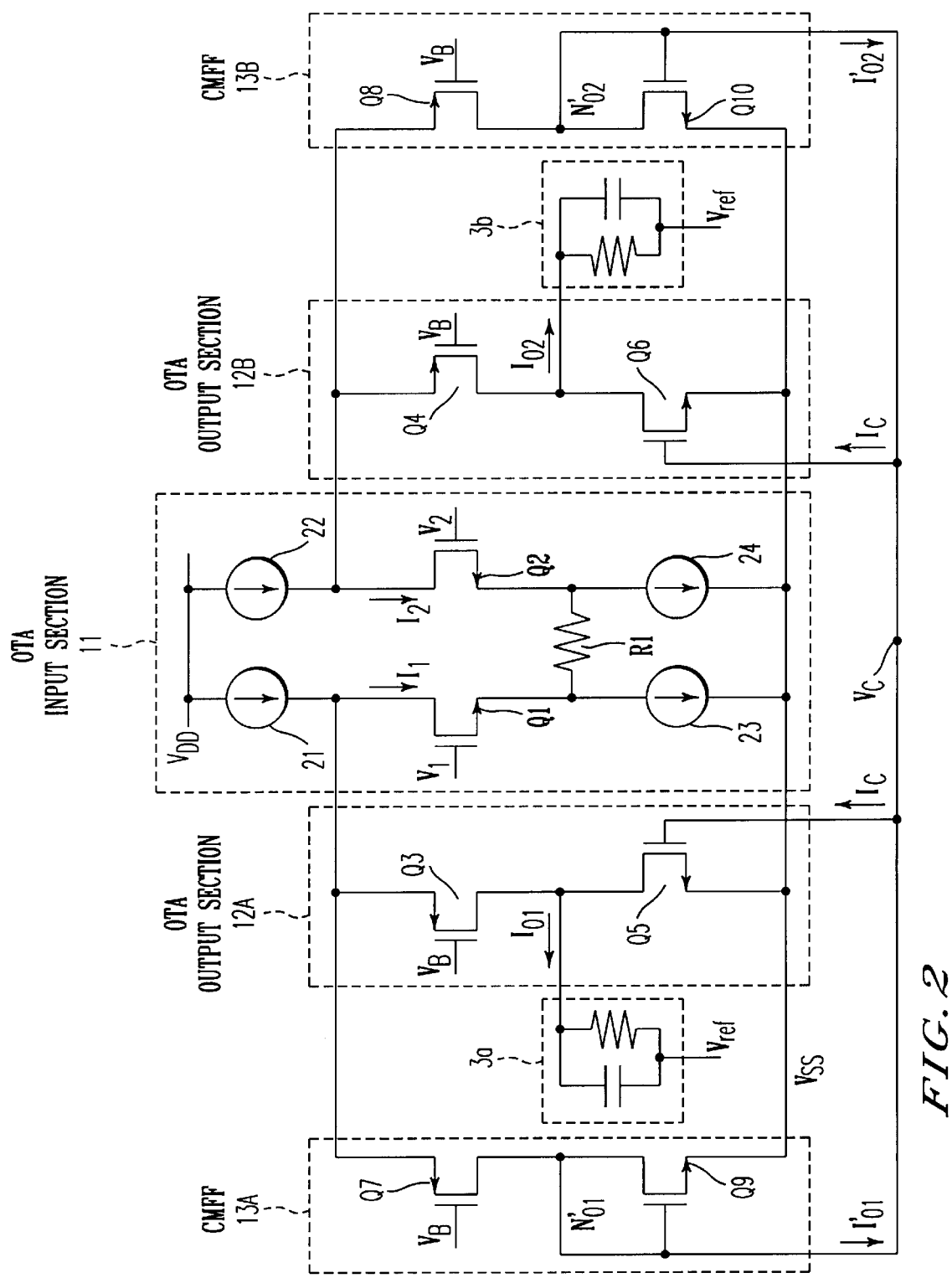
FIG. 2 is a circuit diagram for embodying the differential voltage/fully balanced current converting apparatus shown in FIG. 1.

FIG. 2 shows a practical circuit construction of the embodiment of the differential voltage/fully balanced currents converter shown in FIG. 1.

The OTA input section (11) is comprised of two NMOS transistors (Q1) and (Q2) in which each of gate terminals are respectively coupled to the input voltage $V_1$, $V_2$, each of drain terminals are respectively connected to constant current sources (21) and (22), and a resistor (R1) coupled between source terminals of the NMOS transistors (Q1) and (Q2).

The OTA output section is divided into a first output section (12A) that is coupled to the NMOS transistor (Q1) side in the OTA input section and a second output section (12B) that is coupled to the NMOS transistor (Q2) side in the OTA input section. The first OTA output section (12A) is comprised of a PMOS transistor (Q3) of which source terminal is connected to the constant current sources (21) and gate terminal is coupled to a predetermined voltage $V_B$, and a NMOS transistor (Q5) of which drain terminal is commonly coupled to the drain terminal of the PMOS transistor (Q3) and gate terminal is connected to the control voltage $V_c$. Each of drain terminals of the PMOS transistor (Q3) and NMOS transistor (Q5) are commonly connected to one end of the load circuit (3a), to which the interim current $I_{O1}$ is pushed in. The other end of the load circuit (3a) is coupled to a reference voltage $V_{ref}$. The second OTA output section (12B) is comprised of a PMOS transistor (Q4) of which source terminal is coupled to the constant current source (22) in the OTA input section (11) and a predetermined voltage $V_B$ is applied to its gate terminal, and a NMOS transistor (Q6) of which drain terminal is commonly connected to the drain terminal of the PMOS transistor (Q4) and the control voltage $V_C$ is supplied to its gate terminal. The source terminal of NMOS transistor (Q6) is commonly connected to the constant current sources (23), (24) in the OTA input section (11). The drain terminals of the PMOS transistor (Q4) and NMOS transistor (Q6) are commonly connected to one end of the load circuit (3b) for supplying the interim current $I_{O2}$. The other end of load circuit (3b) is coupled to the reference voltage $V_{ref}$.

One of the features of the apparatus according to the present invention is to construct the CMFF circuit as the same as the OTA output section. Consequently, since the OTA output section is divided into the first and the second section, the CMFF circuit is also divided into a first CMFF section (13A) and a second CMFF section (13B). The source terminal of PMOS transistor (Q7) in the first CMFF section (13A) and the source terminal of PMOS transistor (Q3) in the first OTA output section (12A) are commonly coupled to the constant current sources (21) of the OTA input section (11). The drain terminals of PMOS transistor (Q7) and NMOS transistor (Q9) in the first CMFF section (13A) are commonly connected to the gate terminal of NMOS transistor (Q9). The commonly connected node ($N'_{O1}$) of the drain terminals supplies a control current $I'_{O1}$ from the first CMFF section (13A). Similarly, the source terminals of PMOS transistor (Q8) in the second CMFF section (13B) and PMOS transistor (Q4) in the second OTA output section (12B) are coupled to the constant current sources(22) in the OTA input section (11). The drain terminal of PMOS transistor (Q8) is commonly connected to the drain terminal and gate terminal of NMOS transistor (Q10). From the commonly connected node ($N'_{O2}$), the CMFF section (13B) provides a control current $I'_{O2}$. The control current $I'_{O1}$ from the CMFF section (13A) and the control current $I'_{O2}$ from the CMFF section(13A) are combined together into a sum equals to zero, which corresponds to the control voltage $V_C$. The control voltage $V_C$ is applied as a feedforward signal to the respective gate terminals of the NMOS transistors (Q5) and (Q6) in the first and second OTA output sections (12A) and (12B).

Figure 3:
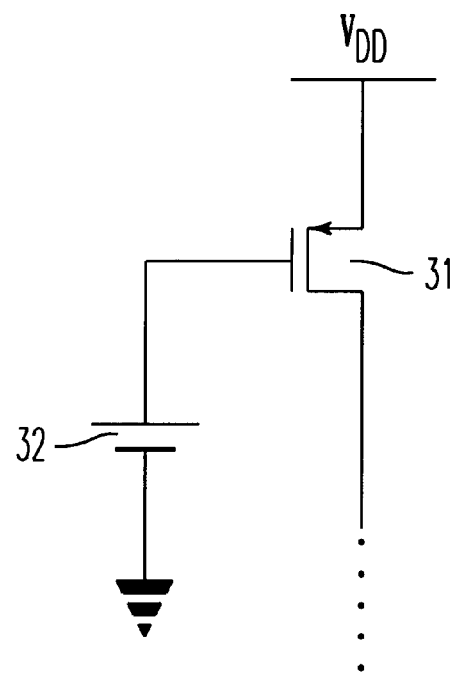
FIG. 3 is a circuit diagram for illustrating an example of the constant-current sources used in the differential voltage/fully balanced currents converting apparatus shown in FIG. 2.

FIG. 3 shows an example circuit implementation of the constant current source, which is shown by a symbol only in many Figures. The respective constant current source is comprised of a source grounded PMOS transistor (31) of that source terminal is connected to a constant voltage source (for example $V_{DD}$) and a constant voltage source connected to the gate terminal of the PMOS transistor (31).

Figure 4:
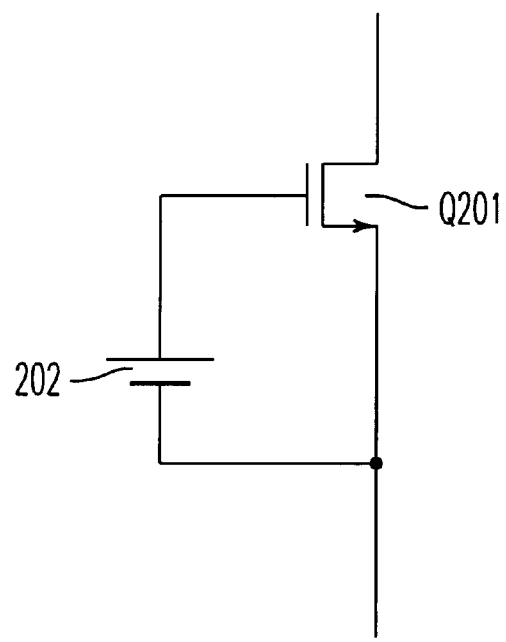
FIG. 4 is a circuit diagram for illustrating another example of the constant-current sources used in the differential voltage/ fully balanced currents converting apparatus shown in FIG. 2 and/or a differential voltage/fully balanced currents converting apparatus shown in FIG. 8.

FIG. 4 shows an example circuit implementation of the constant current source, which is shown by a symbol only in many Figures.

The respective constant current source is comprised of a NMOS transistor (Q201) and a voltage source (202) connected between the gate terminal and the source terminal of the NMOS transistor (Q201).

Figure 5:
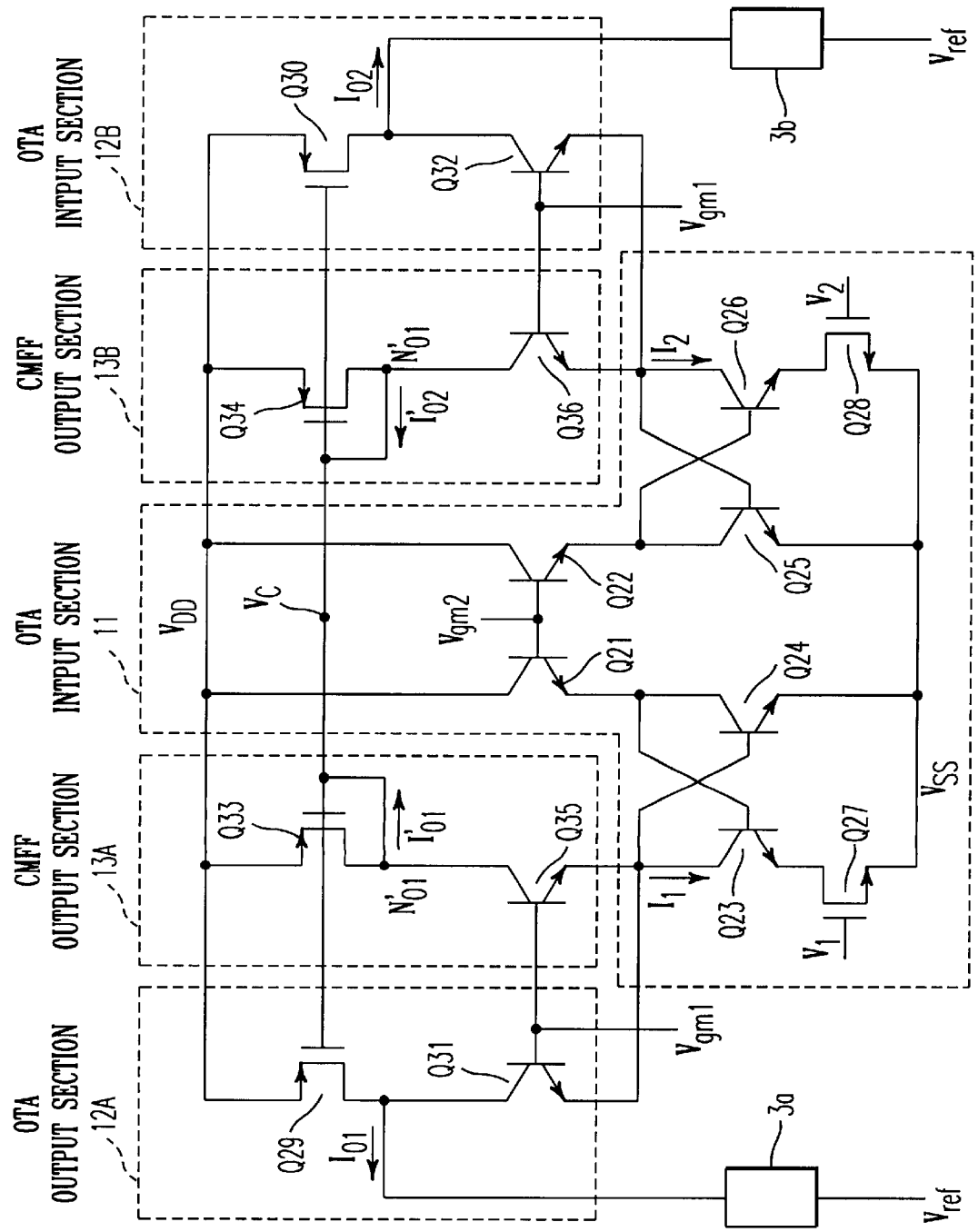
FIG. 5 is a modification of the circuit diagram for embodying the differential voltage/fully balanced currents converting apparatus shown in FIG. 2.

FIG. 5 depicts another embodiment of circuit construction of the feedforward control type differential input voltage/ fully balanced output currents converter in FIG. 1.

In FIG. 5, the OTA input section (11) is comprised of NMOS transistors (Q27) and (Q28) of which each gate terminals are respectively coupled to the respective input voltages $V_1$, $V_2$, NPN transistors (Q23) and (Q26) coupled to the respective drain terminals of the NMOS transistor (Q27) and (Q28), NPN transistors (Q24) and (Q25) of which each emitter terminals coupled to the respective source terminals of the NMOS transistor (Q27) and (Q28), and NPN transistors (Q21) and (Q22) of which each emitter terminals are connected to the respective collector terminals of the NPN transistors (Q24) and (Q25). The base terminals of the NPN transistors (Q21) and (Q22) are commonly connected and supplied by a voltage $V_{gm2}$.

The first and second OTA output sections (12A) and (12B) are respectively comprised of PMOS transistor (Q29) of which source terminal is connected to the power source voltage $V_{DD}$, and NPN transistor (Q31) of which collector terminal is connected to the drain terminal of PMOS transistor (Q29). The emitter terminal of NPN transistor (Q21) is commonly coupled to the collector terminal of NPN transistor (Q24) in the OTA input section (11) and the base terminal of the NPN transistor (Q23).

Similar to the first and second OTA output sections (12A) and (12B), the first and second CMFF sections (13A) and (13B) also are comprised of PMOS transistor (Q33) coupled to the power source voltage $V_{DD}$, and NPN transistor (Q35) of which collector terminal is connected to the common drain/gate terminal of the PMOS transistor. At the common drain terminal coupling node $N'_{O1}=N'_{O2}$, a control voltage $V_c$ is created. It is applied to the gates of PMOS transistors in the OTA output sections (12A) and (12B).

From the drain terminal of the PMOS transistor in the OTA output sections (12A) the output current $I_{O1}$ is going to one end of the load circuit (3a). A reference voltage $V_{ref}$ is applied the other end of the load circuit (3a). From the drain terminal of the PMOS transistor in the OTA output sections (12B) the output current output $I_{O2}$ is going to one end of the load circuit (3b). A reference voltage $V_{ref}$ is applied the other end of the load circuit (3b).

In the voltage/current converter shown in FIG. 5, the gate terminals of PMOS transistor (Q29) and (Q30) in the OTA output section are commonly connected to the respective gate terminals and common gate/drain terminals of PMOS transistor (Q33) and (Q34) in the CMFF circuit. That is, since the feedforward control voltage $V_C$ from the CMFF circuit is applied to the OTA output section, the output common mode voltage becomes to be equal to the reference voltage $V_{ref}$.

In this embodiment, the OTA is divided into an OTA input section and an OTA output section and the feedforward CMFF circuit. The feedforward CMFF circuit is constructed in the same way as the OTA output section for simplifying the system implementation the total apparatus. Further, even when the currents $I_1$, $I_2$ passing through the NMOS transistors (Q27) and (Q28) in the OTA input section (11) include the common mode component, it is possible to eliminate it.

Figure 6:
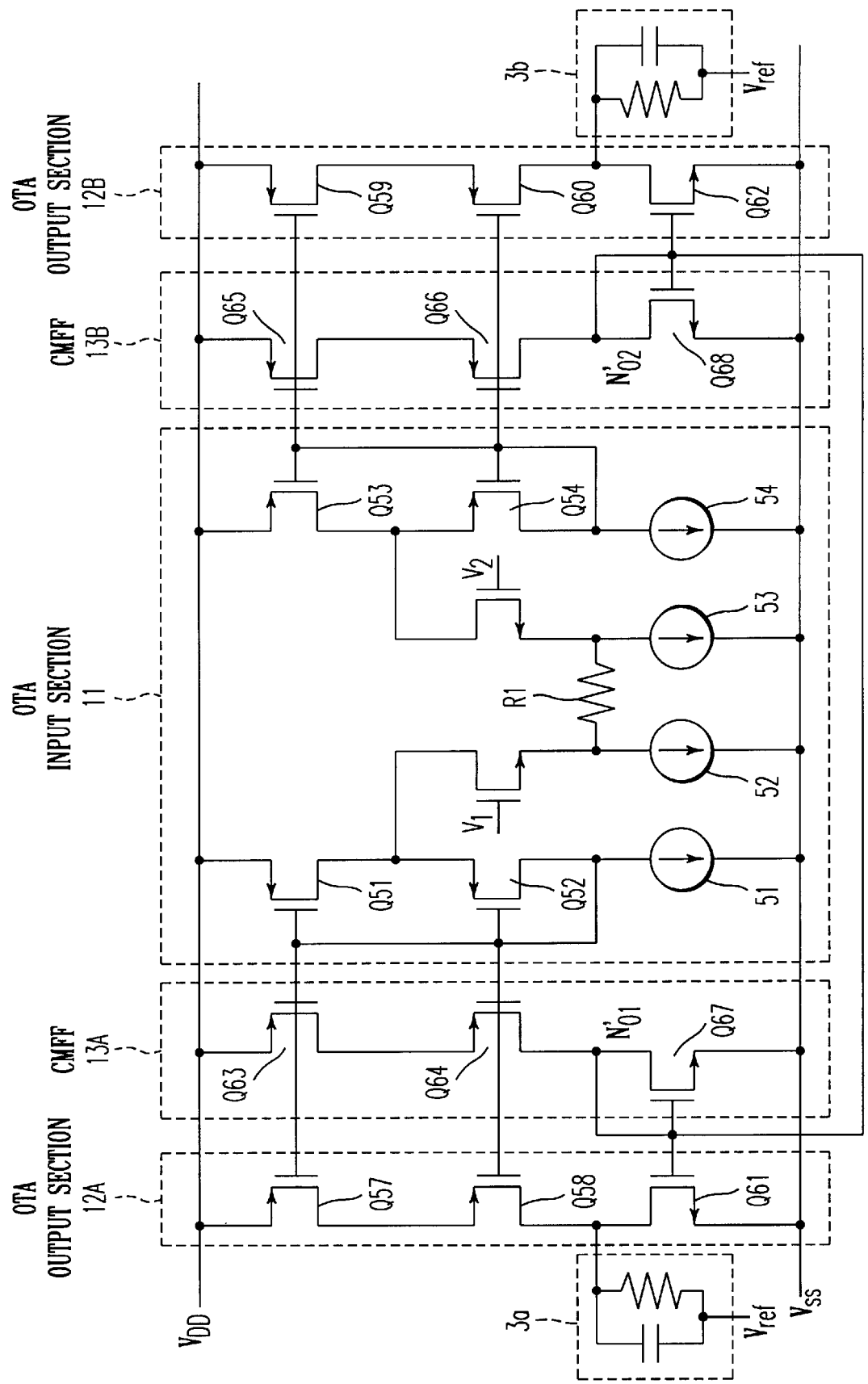
FIG. 6 is another modification of the circuit diagram for embodying the differential voltage/fully balanced currents converting apparatus shown in FIG. 2.

FIG. 6 is a modification of the feedforward control type voltage/current converter shown in FIG. 2. This circuit is aimed to increase the value of a transconductance of the voltage/current converter.

Similarly to FIG. 2, the OTA input section (11) in the fully balanced OTA apparatus includes NMOS transistors (Q55) and (Q56) of which gate terminals are coupled to the respective input voltages $V_1$, $V_2$, and a resistor (R1) connected between the respective source terminals of the NMOS transistors (Q55) and (Q56). Further the OTA input section (11) includes a plurality of pairs of PMOS transistor (Q51)–(Q52) and (Q53)–(Q54). The gates of each pair are commonly connected to the drain terminal of the lower transistor. The OTA output section (12A) and the CMFF section (13A) include pairs of PMOS transistors (Q57)–(Q58) and (Q63)–(Q64) for forming voltage controlled current sources, respectively. Similarly, the OTA output section (12B) and the CMFF section (13B) also include a voltage controlled current source circuits constructed by pairs of PMOS transistors (Q59)–(Q60) and (Q65)–(Q66), respectively. Each pair of PMOS transistors in (12A), (12B), (13A), (13B) operates as cascade circuit, the output impedance of which is much larger in comparison to a single transistor.

Figure 7:
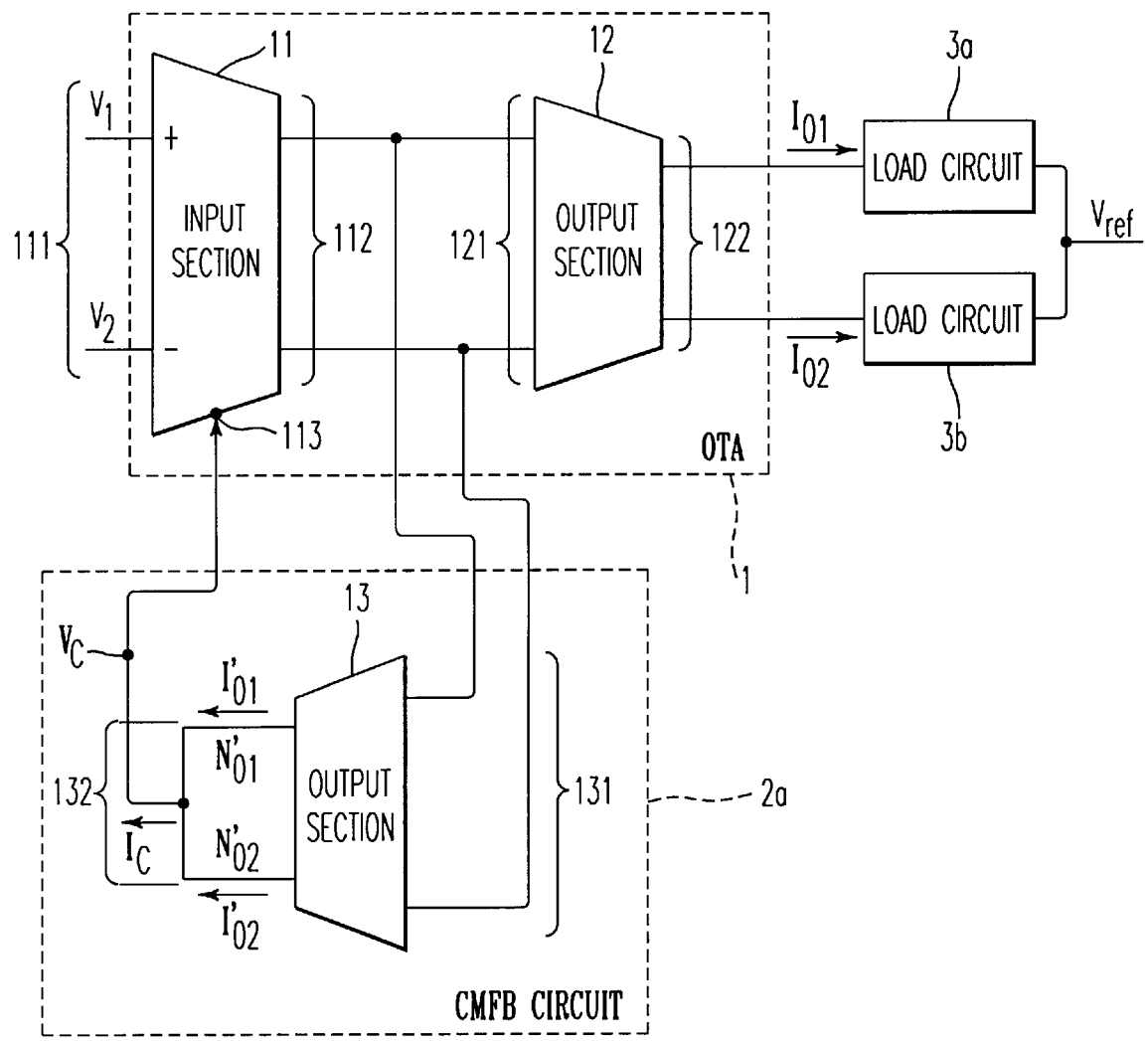
FIG. 7 is a block diagram illustrating the second embodiment of the differential voltage/fully balanced currents converting apparatus according to the present invention.

FIG. 7 is a block diagram illustrating a second embodiment of a feedback control type differential input voltage/fully balanced currents converting apparatus according to the present invention.

As similar to the apparatus shown in FIG. 1, the OTA(1) in FIG. 7 is comprised of an OTA input section (11) and an OTA output section (12). In this embodiment, the input voltages $V_1$, $V_2$ are converted into the interim currents. The interim currents from the OTA input section (11) are pushed to the input terminals of the OTA output section (12) and also to the input terminals of a common mode controlling circuit CMFB circuit (2a). At the output of a CMFB circuit (2a) a feedback control voltage $V_c$, which is applied to the control terminal (113) of an input stage (11), is created. The feedback control voltage $V_c$ makes the common mode component of the output currents $I_{O1}$, $I_{O2}$ from the OTA output section (12) equals to zero or at a priori fixed constant level. The output currents $I_{O1}$, $I_{O2}$ from the OTA output section (12) are going to input sides of the load circuits (3a) and (3b). A reference voltage $V_{ref}$ is supplied to the commonly connected output sides of the load circuits (3a) and (3b).

The CMFB circuit (2a) generates control currents $I'_{O1}$, $I'_{O2}$ based on the supplied interim differential currents from the OTA input section (12). These output currents $I'_{O1}$, $I'_{O2}$ are combined as a sum, the value of which must to be zero. At node $N'_{o1}=N'_{o2}$ a control voltage $V_c$ is created, which is applied to a control terminal (113) of the OTA input section (12) as a feedback signal for current $I_c$ controlling. That is, the control objects on the embodiments in the apparatus shown in FIGS. 1 and 7 are different with each other. The common mode controlling circuit in the former apparatus controls the OTA output section. On the contrary, the common mode controlling circuit in the latter apparatus controls the OTA input section.

When the control terminal (113) of the OTA input section (11) is coupled to the gate terminal of MOS transistor, no current passes through the gate terminal. Accordingly, the control current $I_c$ passing through the output terminals of the CMFB circuit(2a) becomes zero (0). As a result the output currents $I_{o1}$ and $I_{o2}$ become fully balanced and the output common mode voltages of the OTA output section (12) become as equal to as the reference voltage $V_{ref}$, as similar to FIG. 1. That is, this embodiment also can eliminate common mode generated in the OTA input section (11).

Figure 8:
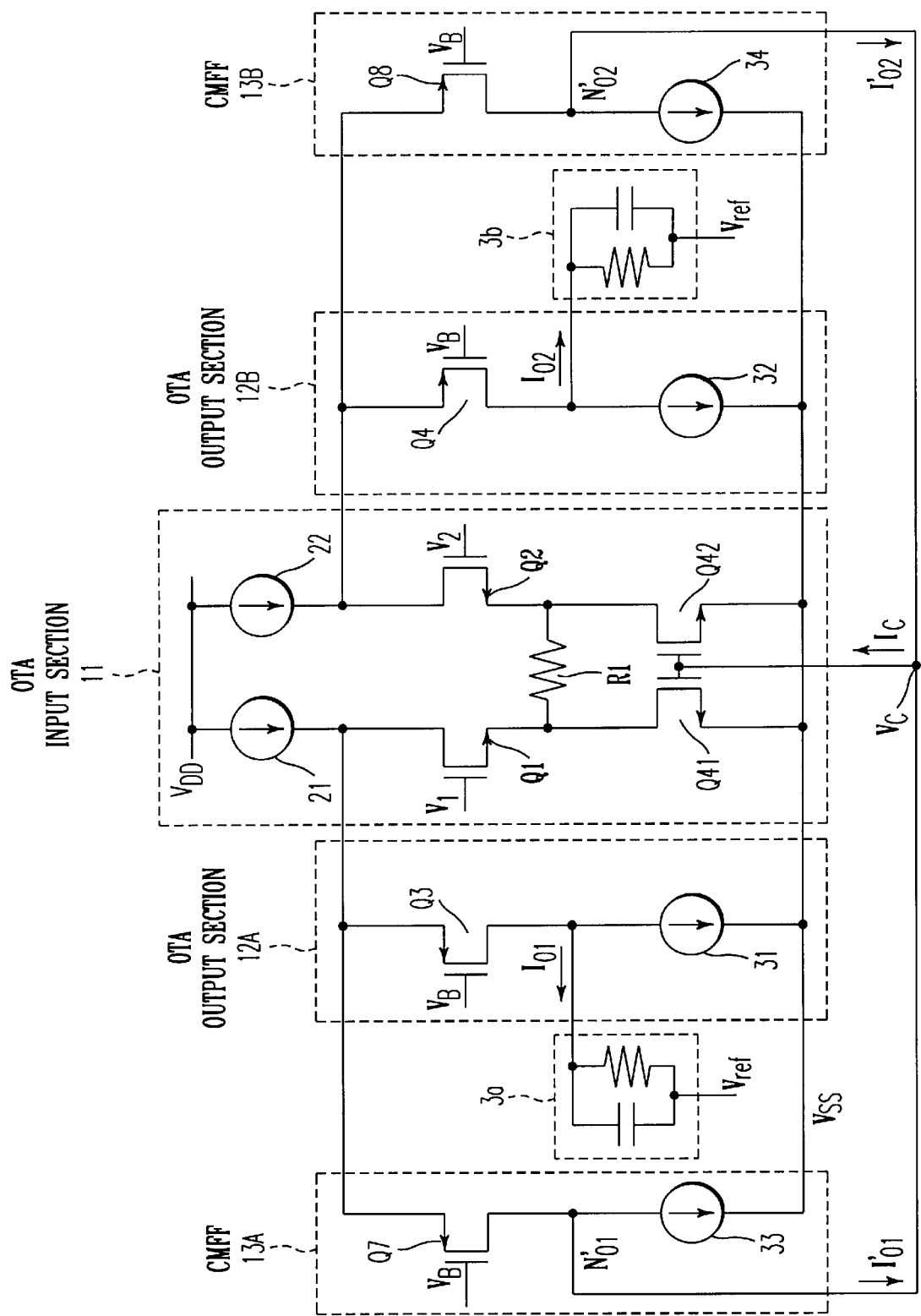
FIG. 8 is a circuit diagram for embodying the differential voltage/fully balanced currents converting apparatus shown in FIG. 7.

FIG. 8 is a circuit embodiment of the feedback control type differential input voltage/fully balanced output currents converting apparatus shown in FIG. 7.

The OTA input section (11) is comprised of NMOS transistors (Q1) and (Q2) of which gate terminals are respectively connected to the differential input voltage $V_1-V_2$, and NMOS transistors (Q41) and (Q42) of which drain terminals are respectively connected to the respective source terminals of the NMOS transistors (Q1) and (Q2). The gate terminals of the NMOS transistors (Q41) and (Q42) are commonly connected.

In the first and second CMFB sections (13A) and (13B), a control voltage $V_B$ is applied to the respective gate terminals of PMOS transistors (Q7) and (Q8). The control currents $I'_{O1}$, $I'_{O2}$ from the CMFB sections (13A) and (13B) are summed up at node $N'_{o1}=N'_{o2}$, from which a control voltage $V_c$ is applied to the commonly connected gate terminals of PMOS transistors (Q41) and (Q42).

Consequently, since the CMFB circuit (2a) controls a bias current in the OTA input section (11) so as that common mode current $I_{cm}$ becomes zero (0), the output common mode voltages of the OTA output section (12) become as equal to the reference voltage $V_{ref}$.

Figure 9:
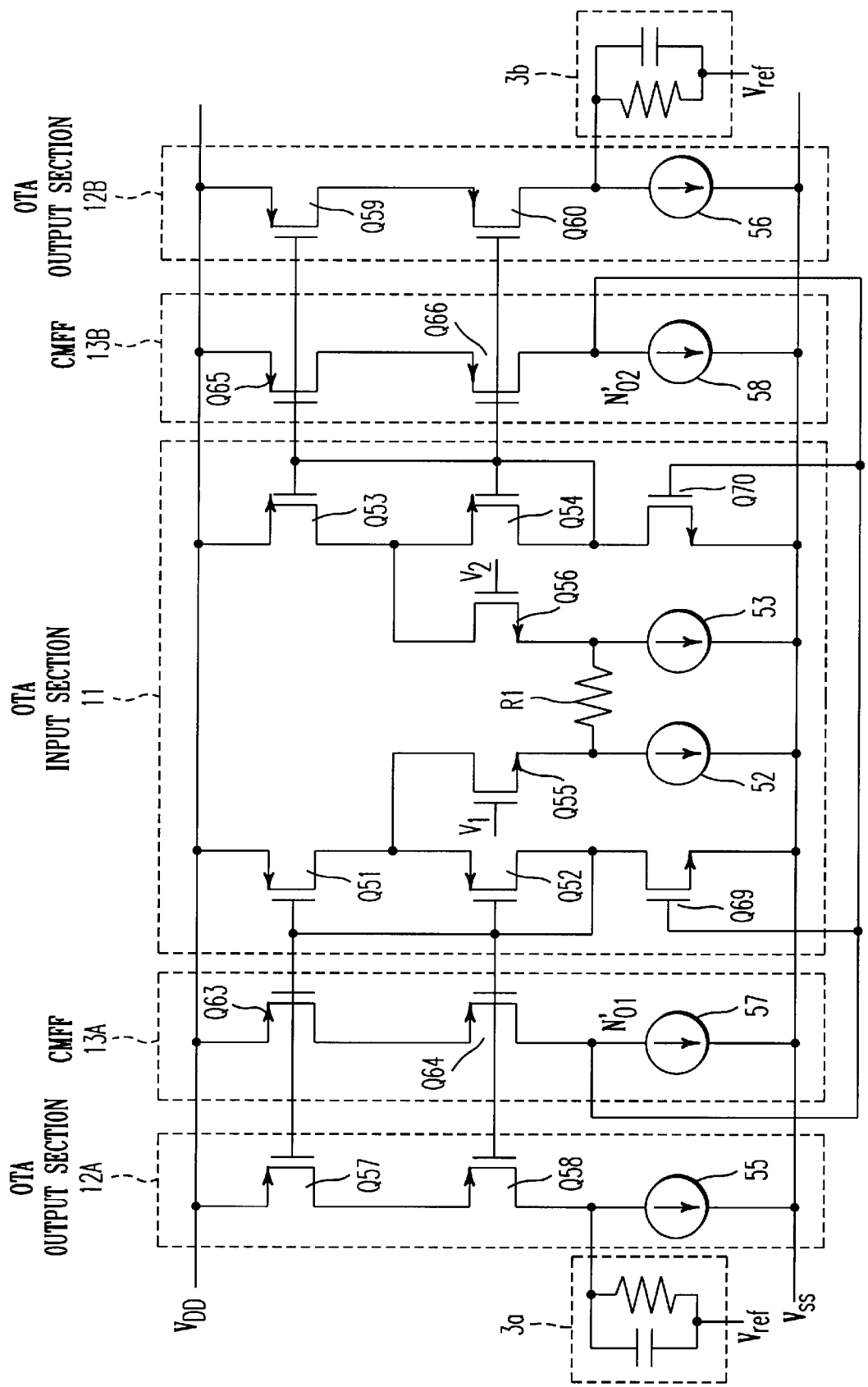
FIG. 9 is a modification of the circuit diagram for embodying the differential voltage/fully balanced currents converting apparatus shown in FIG. 8.

FIG. 9 is another embodiment of circuit construction of the differential input voltage/fully balanced output currents converting apparatus shown in FIG. 7. The OTA output section (12A) and the CMFB section (13A) include pairs of PMOS transistors (Q57)–(Q58) and (Q63)–(Q64) for forming voltage controlled current sources, respectively. Similarly, the OTA output section (12B) and the CMFB section (13B) also include a voltage controlled current source circuits constructed by pairs of PMOS transistors (Q59)–(Q60) and (Q65)–(Q66), respectively. Each pair of PMOS transistors in (12A), (12B), (13A), (13B) operates as cascode circuit, the output impedance of which is much larger in comparison to a single transistor.

Figure 10:
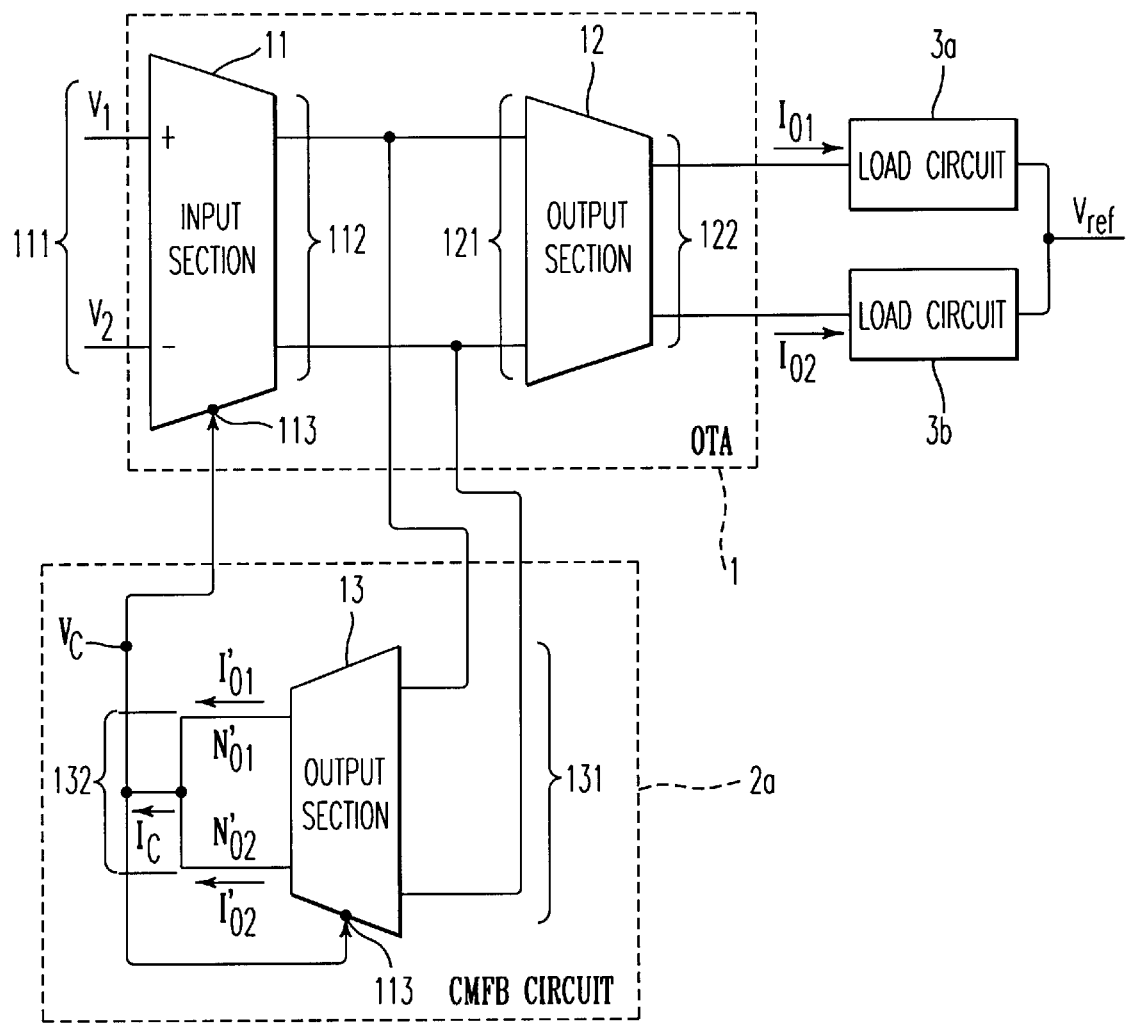
FIG. 10 is a block diagram illustrating the third embodiment of the differential voltage/fully balanced currents converting apparatus according to the present invention.

FIG. 10 shows a third embodiment of the voltage/current converting apparatus according to the present invention.

In this embodiment, the apparatus is comprised of an OTA (1) which is included of an OTA input section (11) and OTA output section (12), and a CMFB circuit (2a) that is constructed as the same as the OTA output section (12). The control voltage $V_c$ from CMFB circuit (2a) is applied to the OTA input section (11) and the CMFB circuit (2a) itself.

The differential input voltage $V_1-V_2$ applied to the input terminals (111) of the OTA input section (11) is converted into interim currents. The first part of converted interim currents are pushed to the input terminals of the OTA output section (12) for converting to fully balanced output currents $I_{O1}$, $I_{O2}$. The output terminals of the OTA output section (12) are coupled to load circuits (3a) and (3b), respectively. A reference voltage $V_{ref}$ is supplied to the output terminals of the load circuit(3a) and (3b).

The second part of the interim currents from the OTA input section (11) are pushed to the input terminals of the CMFB circuit (2a) for generating control currents $I'_{O1}$, $I'_{O2}$ which are combined into a sum current Ic. This sum is equal to zero and a control voltage $V_c$ is created in this node. The control voltage $V_c$ is applied to both the control terminals (113) of the OTA input section (12) and the control terminal (133) of the CMFB circuit (13) itself for improving frequency characteristics of the apparatus.

Figure 11:
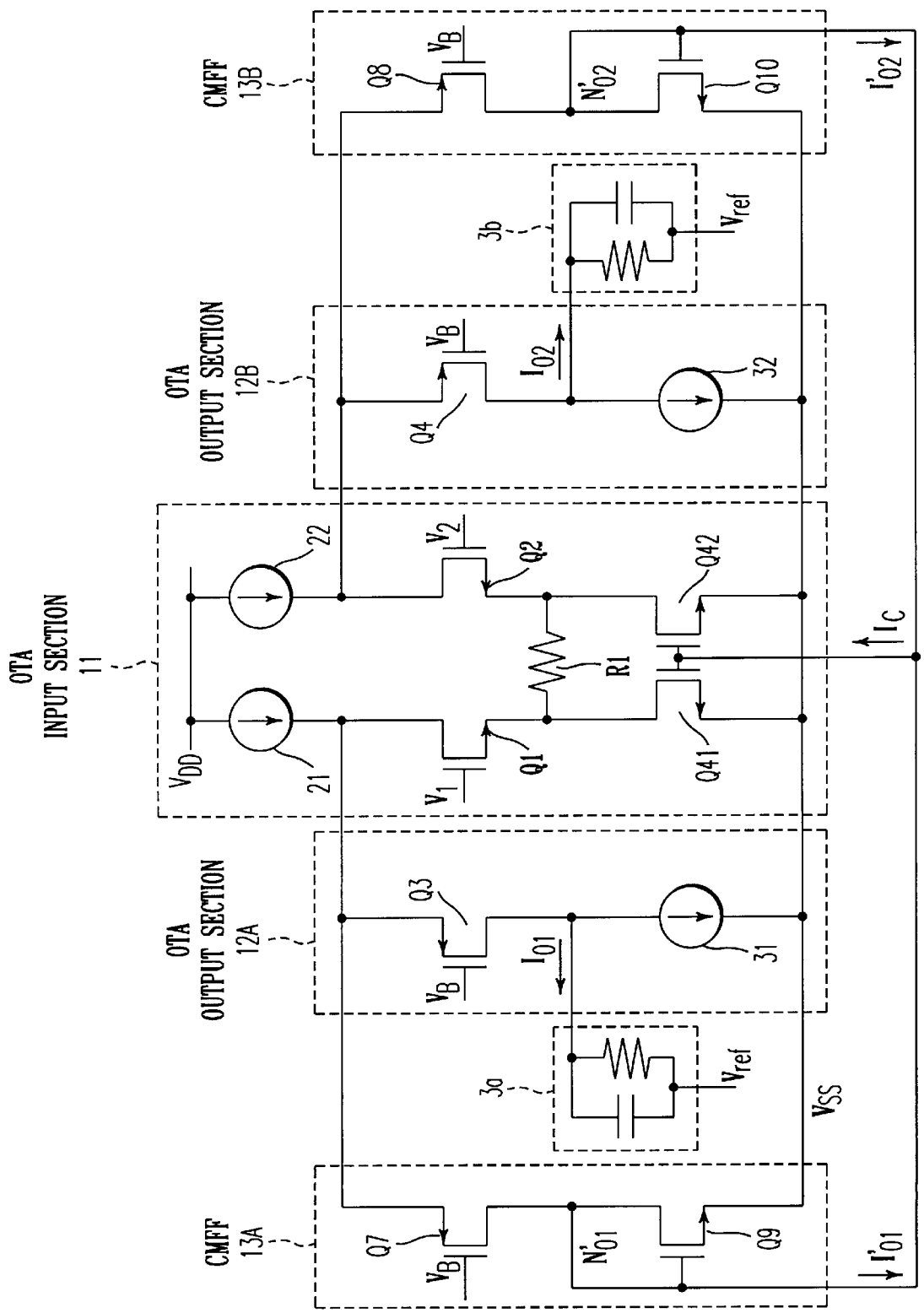
FIG. 11 is a circuit diagram for embodying the differential voltage/fully balanced currents converting apparatus shown in FIG. 10.

FIG. 11 is an embodiment of the circuit construction of the voltage/currents converting apparatus shown in FIG. 10.

The OTA input section (11) is comprised of constant current sources (21) and (22) coupled to a power source voltage $V_{DD}$, NMOS transistors (Q1) and (Q2) of which drain terminals are respectively coupled to each of the constant current sources (21) and (22), and NMOS transistors (Q41) and (Q42) of which drain terminals are respectively coupled to each of the source terminals of the NMOS transistors (Q1) and (Q2), and a resistor (R1). The input voltages $V_1$ and $V_2$ are respectively applied to the gate terminals of the NMOS transistors (Q1) and (Q2).

The first and second OTA output sections (12A) and (12B) are respectively comprised of PMOS transistors (Q3) and (Q4) of which gate terminals are connected to a bias voltage $V_B$, and constant current sources (31) and (32). The first and second CMFB sections (13A) and (13B) are respectively comprised of PMOS transistors (Q7) and (Q8) of which gate terminals are connected to the bias voltage $V_B$, and NMOS transistors (Q9) and (Q10) of which drain terminals are respectively coupled to the drain terminals of the PMOS transistors (Q7) and (Q8).

In this embodiment, the circuit construction of the OTA output section is slightly different from the CMFB circuit. The commonly connected gate terminals of the PMOS transistors (Q41) and (Q42) in the OTA input section (11) is feedback controlled by the voltage of node $N'_{o1}=N'_{o2}$. The constant current sources (31) and (32) are the same one shown in FIG. 4.

In this embodiment, the gate terminals and drain terminals in the respective NMOS transistors (Q9) and (Q10) are directly connected for reducing an output impedance of the CMFB circuit(2a). Consequently, it can improve the frequency characteristics of the voltage/currents converting apparatus in comparing to the apparatus shown in FIG. 8.

Figure 12:
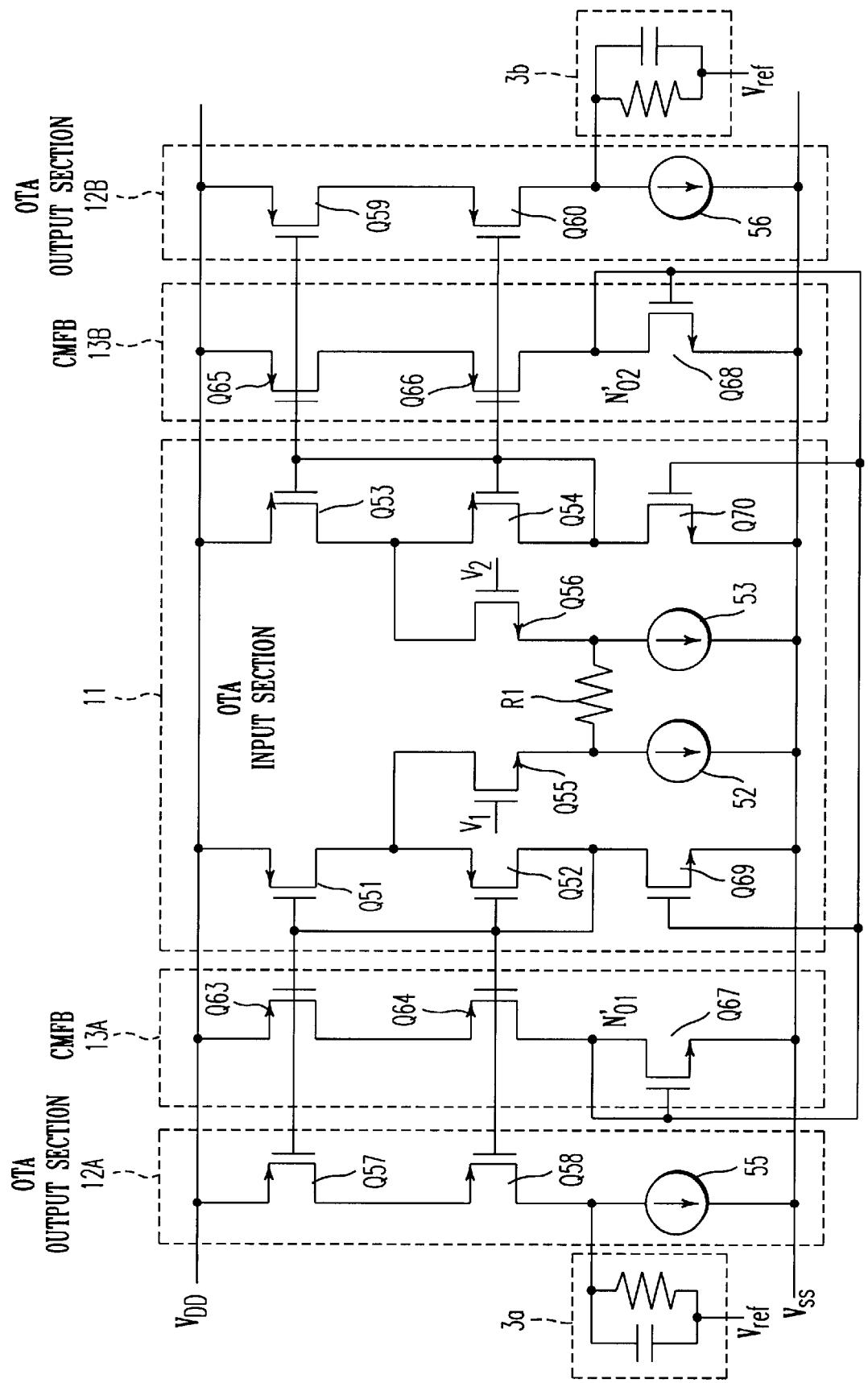
FIG. 12 is a modification of the circuit diagram for embodying the differential voltage/fully balanced currents converting apparatus shown in FIG. 11.

FIG. 12 is another embodiment of the circuit construction of the differential input voltage/fully balanced output currents converting apparatus shown in FIG. 11.

As similar to the voltage/current converting apparatus shown in FIG. 6, the two PMOS transistors (Q57) and (Q58) in the OTA output section (12A), and the PMOS transistors (Q63) and (Q64) in the CMFB section (13A) are respectively construct voltage controlled current source circuits. Similarly, PMOS transistors (Q59), (Q60) in OTA output section (12B), and PMOS transistors (Q65), (Q66) in the CMFB section (13B) construct voltage controlled current source circuits. All the above pairs operate as a cascade and their output impedances are much larger in comparison to the single transistor. A such approach contribute to the accuracy improvement.

Figure 13:
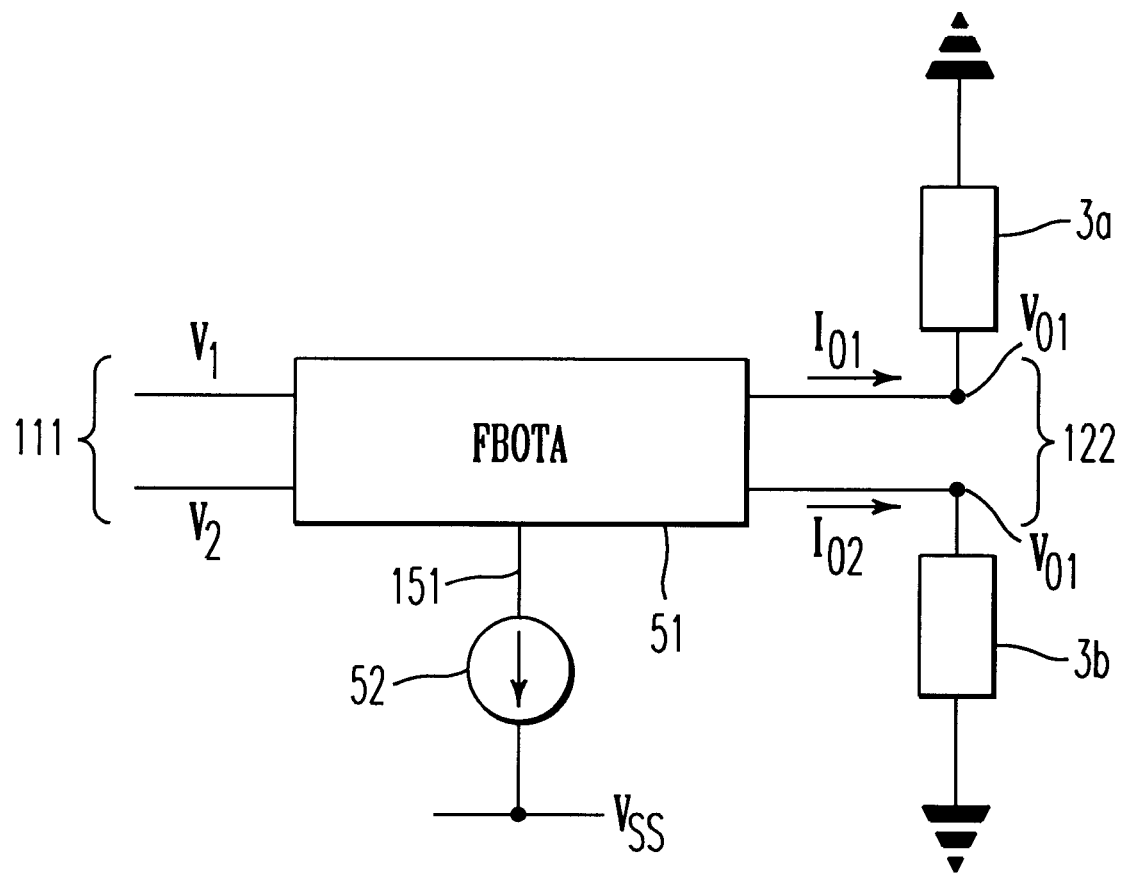
FIG. 13 is a block diagram illustrating the fourth embodiment of the fully balanced voltage/current converting apparatus according to the present invention.
Figure 14:
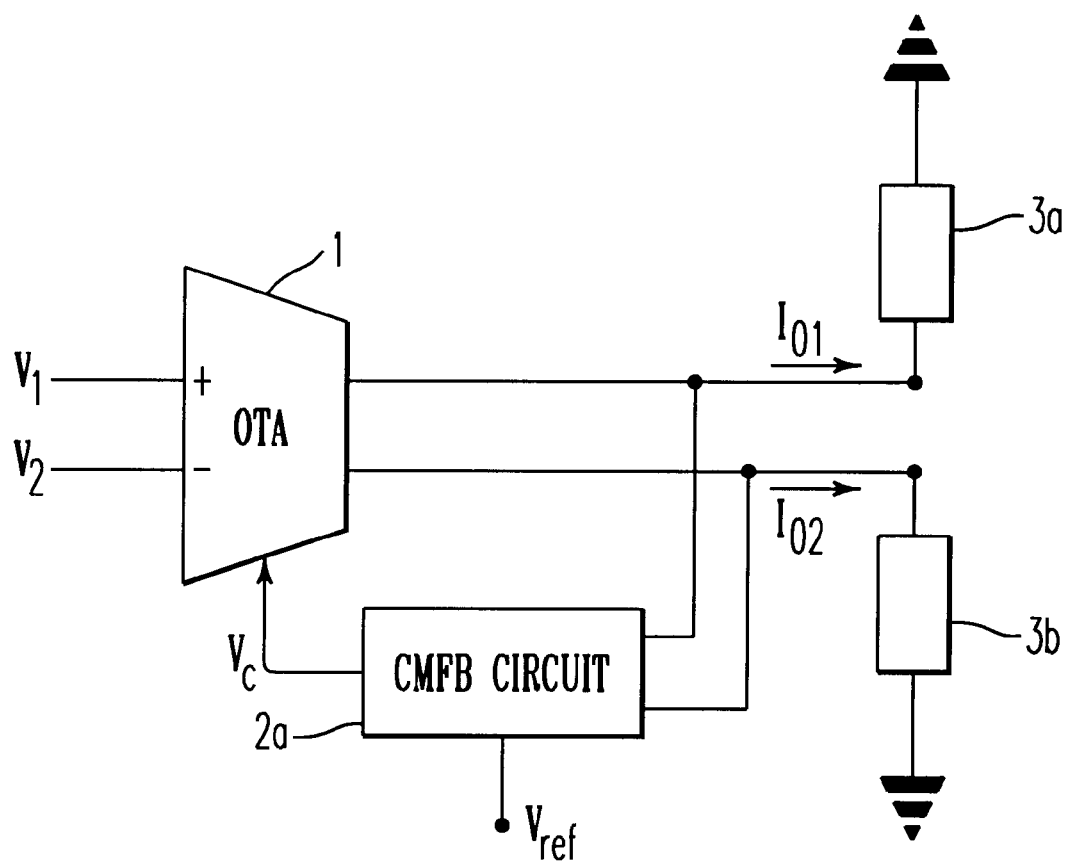
FIG. 14 is a block diagram illustrating a conventional differential voltage/fully balanced currents converter.
Figure 15:
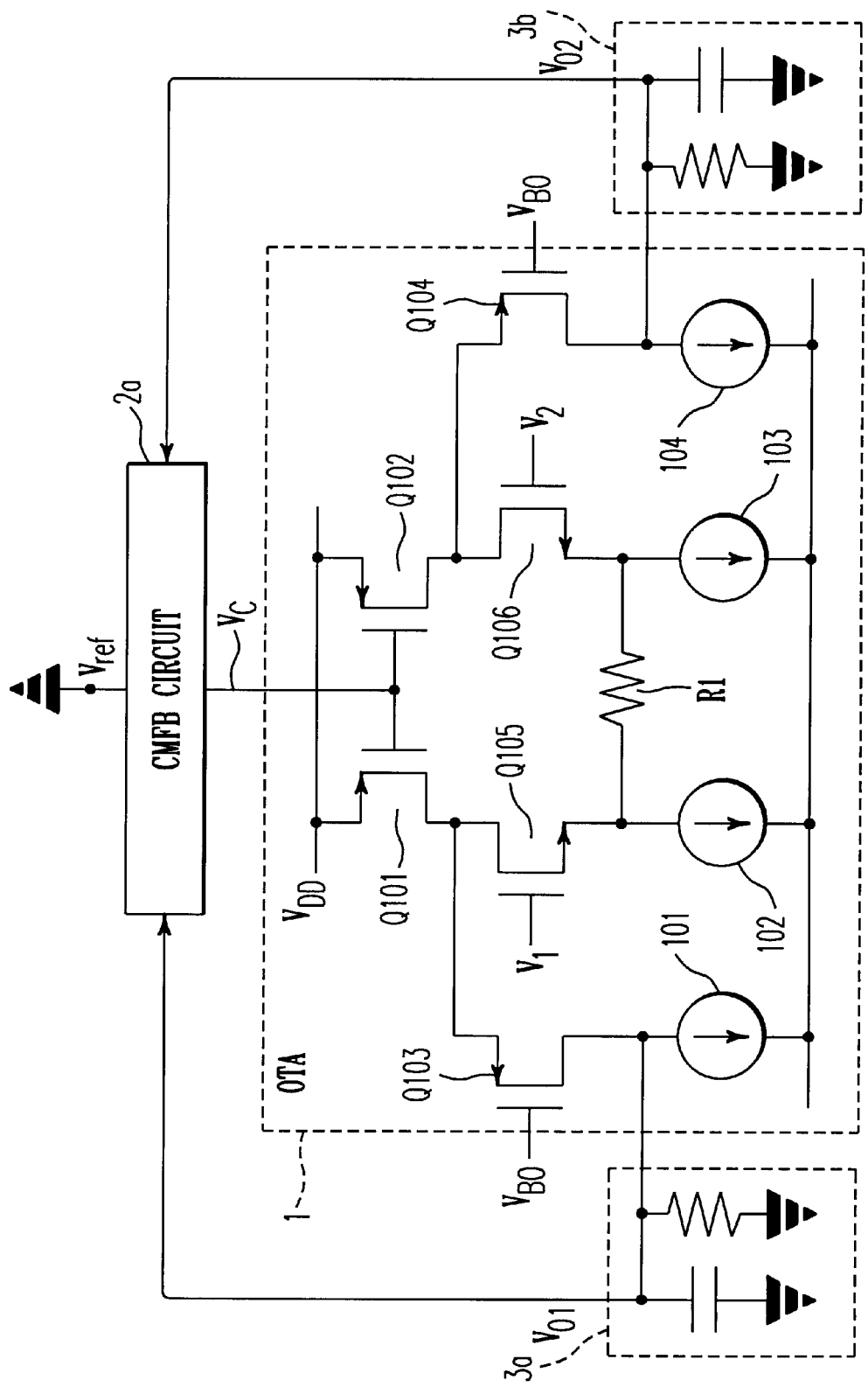
FIG. 15 is a circuit diagram of the operational transconductance amplifier for embodying the conventional differential voltage/fully balanced currents converter shown in FIG. 14.
Figure 16:
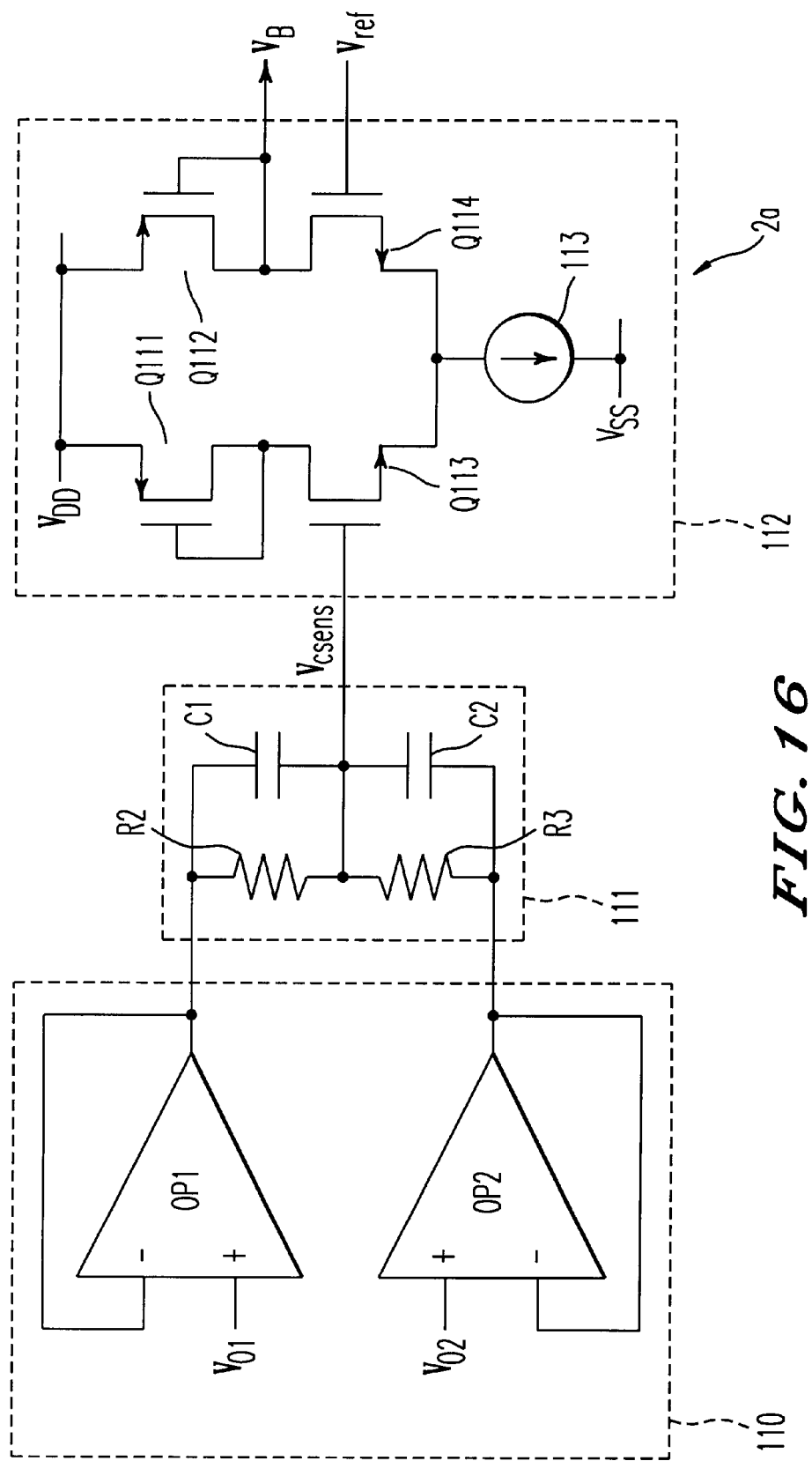
FIG. 16 is a circuit diagram for embodying the common mode feedback control circuit in the conventional differential voltage/fully balanced currents converter shown in FIG. 14.
Figure 17:
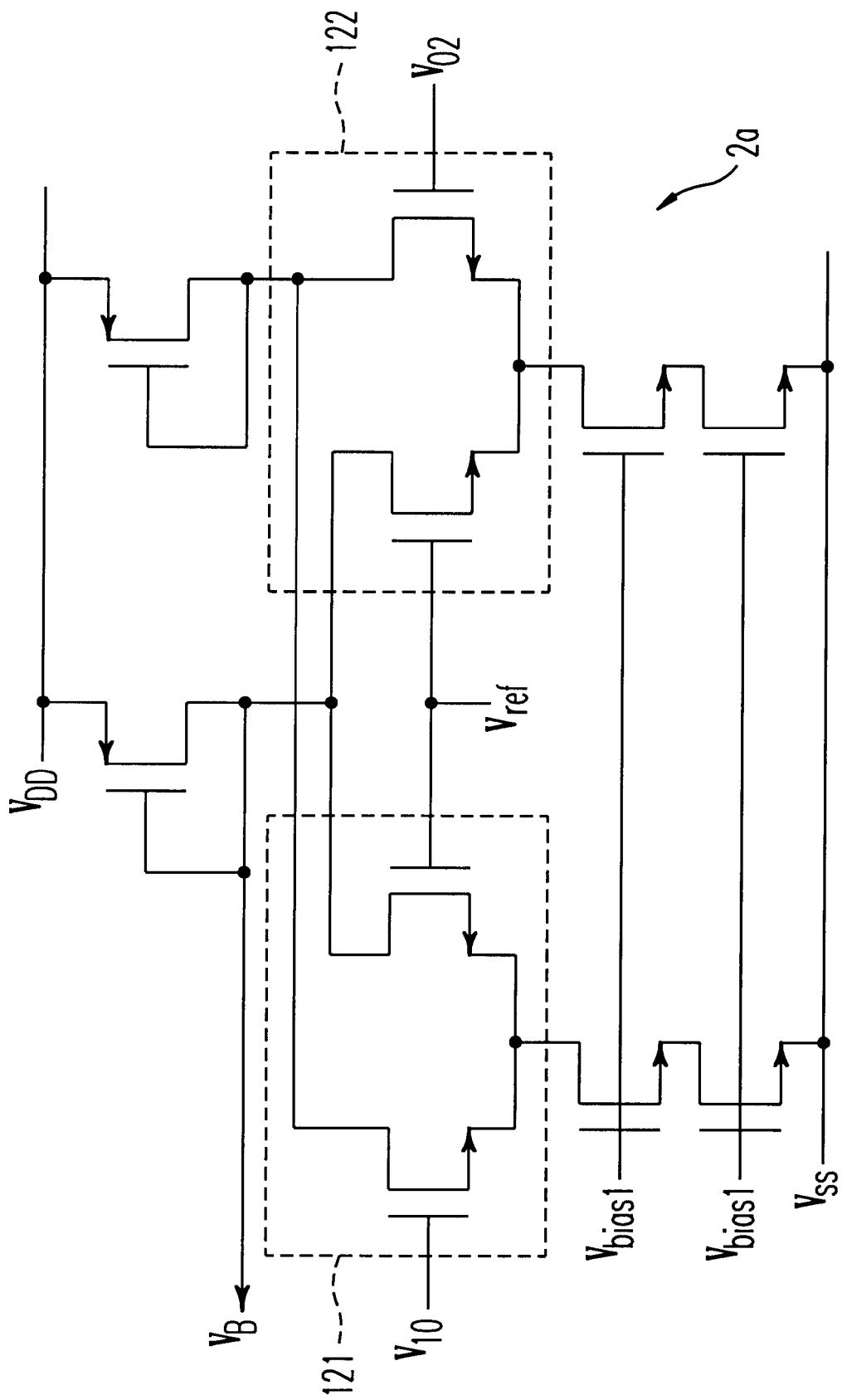
FIG. 17 is another circuit diagram for embodying the common mode feedback control circuit in the conventional differential voltage/fully balanced currents converter shown in FIG. 14.
Figure 18:
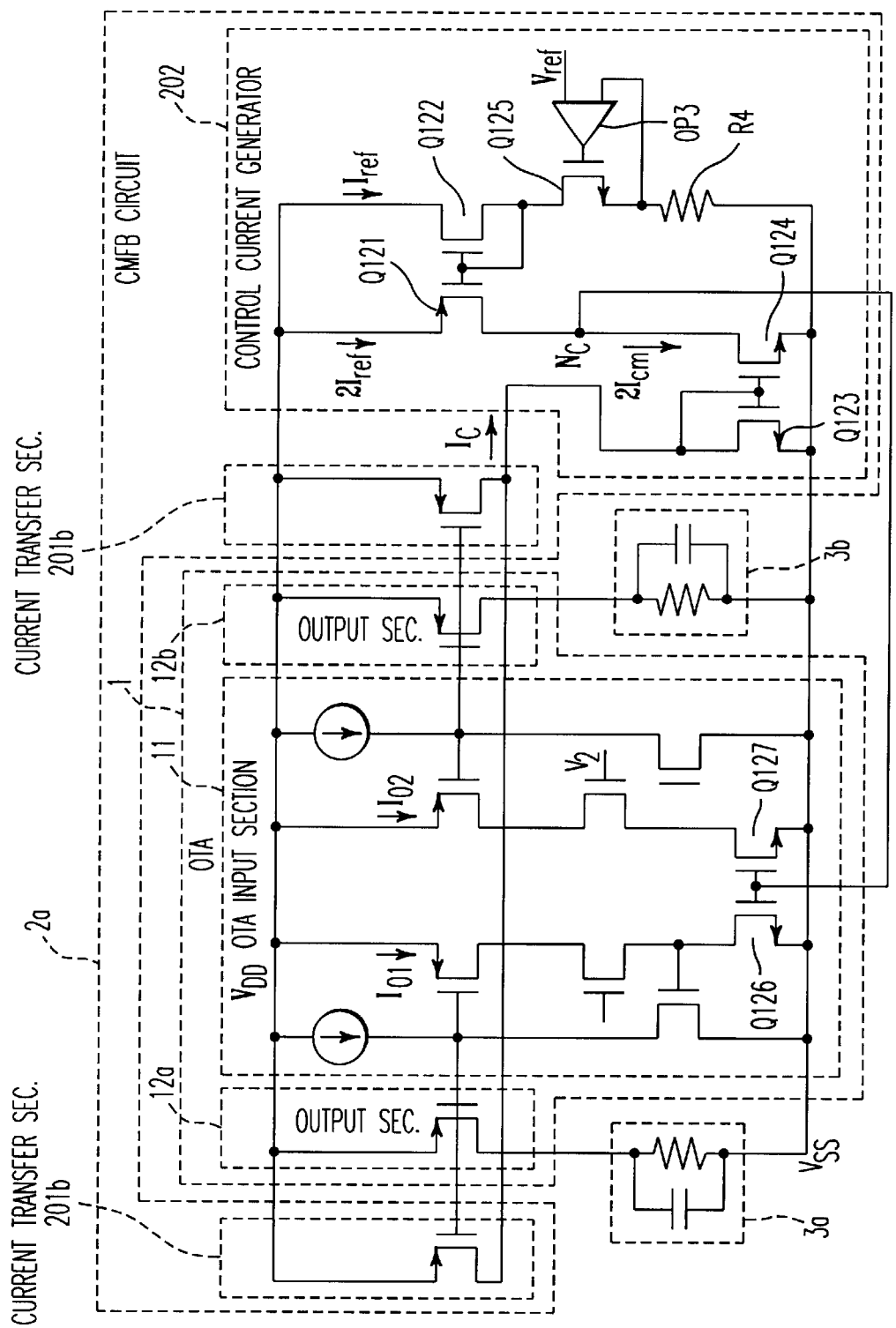
FIG. 18 is another circuit diagram for embodying the conventional differential voltage/fully balanced currents converter.
Figure 19:
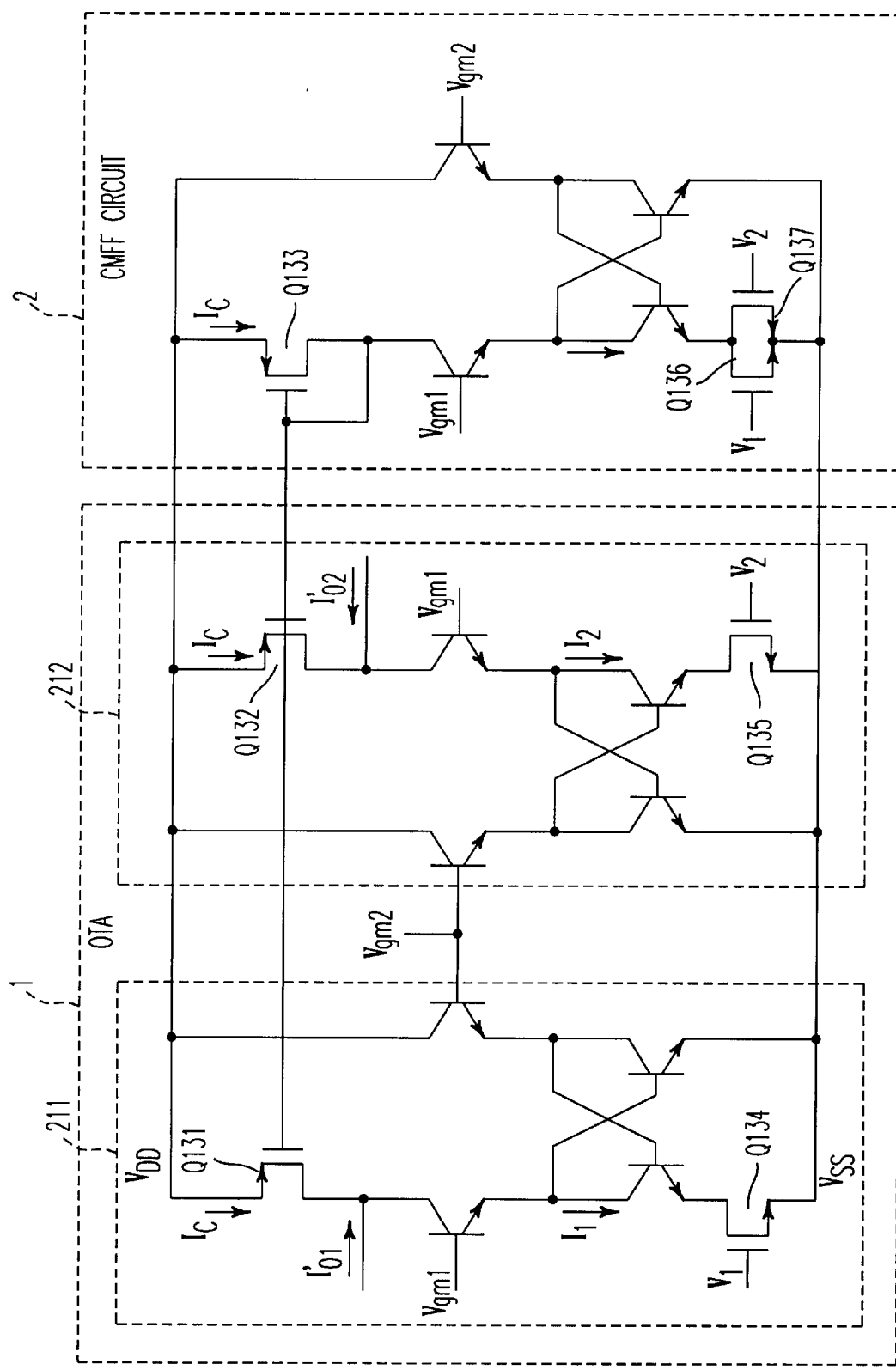
FIG. 19 is still another circuit diagram for embodying the conventional differential voltage/fully balanced currents converter.

FIG. 13 is a fourth embodiment of the differential voltage/fully balanced output currents converting apparatus according to the present invention.

This embodiment is comprised of a differential input voltage/fully balanced output currents converting apparatus (FB-OTA) (51), such as shown in FIGS. 1, 7 and 10, and a constant current source (52) that is coupled to the control terminals of the CMFF circuit or the CMFB circuit for determining the output common mode voltage at an optional level.

For example, when the control terminal of the OTA output section is coupled to the gate terminal of the MOS transistor such as shown in FIG. 2, the constant current source (52) controls so as to that the sum of currents $I'_{o1}$ and $I'_{o2}$ becomes zero (0).

When the constant current source (52) with the current value of $I_{cref}$ is coupled to the output terminal (151) of the voltage/currents converter (51), the output common mode voltage can be represented by the following equation.

$$(V_{o1}+V_{o2})/2 = V_{ref} + I_{cref}/Y$$

here, Y is admittance of the respective load circuits (3a) and (3b), $V_{ref}$ is a reference voltage supplied to one end of the respective load circuits (3a) and (3b), $I_{cref}$ is a current passed through the current source (52).

That is, the DC common mode output voltage can be controlled by the current passed through the current source (52) by coupling the current source to the fully balance OTA.

As explained the above, the differential input voltage/fully balanced output current converting apparatus according to the present invention can achieve a simplified total configuration and a lower power consumption. Furthermore, the apparatus and method for converting differential input voltage to fully balanced output currents according to the present invention can control common mode component of the output currents and can stabilized the common mode output voltage at the desired level.

What is claimed is:

1. An apparatus for converting a differential input voltage into two fully balanced output currents, comprising:
   a voltage/current converting circuit comprising:
      a pair of input terminals for receiving two input voltages of said differential input voltage;
      a pair of output terminals for supplying said two output currents;
      a control terminal;
      a converting circuit input section configured to convert said two input voltages to two interim output signals; and
      a converting circuit output section configured to convert said two interim output signals to said two output currents passing through said pair of output terminals;
   a common mode control circuit configured to control the two output currents passing through said pair of output terminals and to receive said two interim output signals, said control circuit having substantially identical circuit construction of said circuit output section and generating a control voltage signal based on said two interim output signals from said converting circuit input section, the control voltage being supplied to said control terminal of said voltage/current converting circuit; and
   a pair of load circuits, each of said load circuits being coupled correspondingly between each of said output terminals of said voltage/current converting circuit and a reference voltage, said pair of load circuits keeping an output common mode voltage of said output terminals of said voltage/current converting circuit at a predetermined value;
   wherein said control voltage signal is based on a sum of two control output currents that are generated from said common mode control circuit based on said two interim output signals;
   wherein said control terminal of said voltage/current converting circuit is provided in said converting circuit output section and has a high impedance, said common mode control circuit including a control terminal of a high impedance for receiving said control voltage signal, said two output control currents generated by said common mode control circuit being summed and maintained at a substantially zero value.

2. An apparatus for converting a differential input voltage into two fully balanced output currents, comprising:
   a voltage/current converting circuit comprising:
      a pair of input terminals for receiving two input voltages of said differential input voltage;
      a pair of output terminals for supplying said two output currents;
      a control terminal;
      a converting circuit input section configured to convert said two input voltages to two interim output signals; and
      a converting circuit output section configured to convert said two interim output signals to said two output currents passing through said pair of output terminals;
   a common mode control circuit configured to control the two output currents passing through said pair of output terminals and to receive said two interim output signals, said control circuit having substantially identical circuit construction of said circuit output section and generating a control voltage signal based on said two interim output signals from said converting circuit input section, the control voltage being supplied to said control terminal of said voltage/current converting circuit; and
   a pair of load circuits, each of said load circuits being coupled correspondingly between each of said output terminals of said voltage/current converting circuit and a reference voltage, said pair of load circuits keeping an output common mode voltage of said output terminals of said voltage/current converting circuit at a predetermined value;

wherein said control voltage signal is based on a sum of two control output currents that are generated from said common mode control circuit based on said two interim output signals;

wherein said control terminal of said voltage/current converting circuit is provided in said converting circuit input section and has a high impedance, said two output control currents generated by said common mode control circuit beings summed at a common node and maintained at a substantially zero value, said control voltage signal being created at said common node.

3. The apparatus according to claim 2, wherein said common mode control circuit comprises a control terminal for inputting said control voltage signal.

4. The apparatus according to claim 1, further comprising a constant current source connected to said control terminal of said voltage/current converting circuit for additionally adjusting a predetermined value of said output common mode voltage.

5. The apparatus according to claim 2, further comprising a constant current source connected to said control terminal of said voltage/current converting circuit for additionally adjusting a predetermined value of said output common mode voltage.

6. The apparatus according to claim 3, further comprising a constant current source connected to said control terminal of said voltage/current converting circuit for additionally adjusting a predetermined value of said output common mode voltage.

7. A method for converting a differential input voltage to fully balance two output currents, the method comprising the steps of:

converting a pair of input voltages of a differential input voltage supplied to a pair of input terminal of an OTA input section into two interim output signals;

simultaneously providing said pair of interim output signals to a pair of input terminals of an OTA output section and a pair of input terminals of a common mode control circuit;

generating a pair of output control current signals from said common mode control circuit based on said interim output signals from said OTA input section;

generating a common mode control voltage signal based on a sum of said pair of output control current signals; and providing said common mode control voltage signal to a control terminal of said OTA for keeping output common mode voltage of said OTA at a reference voltage;

wherein said step of providing the common mode control voltage comprises providing said common mode control voltage by said common mode controlling circuit to a control terminal of said OTA output section.

8. The method according to claim 7, wherein said step of providing common mode control voltage comprises providing said common mode control voltage by said common mode controlling circuit to a control terminal of said OTA input section.

9. The method according to claim 7, further comprising adjusting a predetermined value of said output common mode voltage with a constant current source coupled to said OTA.

* * * * *